(12) United States Patent
Frey et al.

(10) Patent No.: US 10,126,901 B1
(45) Date of Patent: Nov. 13, 2018

(54) TOUCH SCREEN SENSOR

(71) Applicant: 3M INNOVATIVE PROPERTIES COMPANY, St. Paul, MN (US)

(72) Inventors: Matthew H. Frey, Cottage Grove, MN (US); Michael J. Robrecht, Shorewood, WI (US); George F. Jambor, Burlington, WI (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 16/043,799

(22) Filed: Jul. 24, 2018

Related U.S. Application Data

(63) Continuation of application No. 15/351,695, filed on Nov. 15, 2016, which is a continuation of application
(Continued)

(51) Int. Cl.
| | |
|---|---|
| *G06F 3/044* | (2006.01) |
| *G06F 3/045* | (2006.01) |
| *G06F 3/041* | (2006.01) |
| *C23F 1/14* | (2006.01) |
| *C23F 1/02* | (2006.01) |
| *G01R 27/26* | (2006.01) |

(52) U.S. Cl.
CPC .............. *G06F 3/044* (2013.01); *C23F 1/02* (2013.01); *C23F 1/14* (2013.01); *G01R 27/2605* (2013.01); *G06F 3/045* (2013.01); *G06F 3/0412* (2013.01); *G06F 2203/04108* (2013.01); *G06F 2203/04112* (2013.01)

(58) Field of Classification Search
CPC ...................... G06F 3/044; G06F 3/045; G06F 2203/04112; G06F 2203/04108; G06F 3/0412; C23F 1/02; C23F 1/14; G01R 27/2605
See application file for complete search history.

(56) References Cited

U.S. PATENT DOCUMENTS

| | | | |
|---|---|---|---|
| 4,087,625 A | 5/1978 | Dym et al. | |
| 5,113,041 A | 5/1992 | Blonder et al. | |

(Continued)

FOREIGN PATENT DOCUMENTS

| | | |
|---|---|---|
| EP | 0 911 906 | 4/1999 |
| JP | S62-70473 | 5/1987 |

(Continued)

OTHER PUBLICATIONS

Ulman, "Formation and Structure of Self-Assembled Monolayers", *Chemical Reviews*, vol. 96, pp. 1533-1554 (1996).
(Continued)

*Primary Examiner* — Aneeta Yodichkas

(57) ABSTRACT

A touch screen sensor includes a visible light transparent substrate and an electrically conductive micropattern disposed on or in the visible light transparent substrate. The micropattern includes a first region micropattern within a touch sensing area and a second region micropattern. The first region micropattern has a first sheet resistance value in a first direction, is visible light transparent, and has at least 90% open area. The second region micropattern has a second sheet resistance value in the first direction. The first sheet resistance value is different from the second sheet resistance value.

7 Claims, 11 Drawing Sheets

Related U.S. Application Data

No. 14/174,199, filed on Feb. 6, 2014, now Pat. No. 9,823,786, which is a continuation of application No. 13/590,523, filed on Aug. 21, 2012, now Pat. No. 8,704,799, which is a continuation of application No. 12/393,194, filed on Feb. 26, 2009, now Pat. No. 8,274,494.

(60) Provisional application No. 61/032,273, filed on Feb. 28, 2008, provisional application No. 61/032,269, filed on Feb. 28, 2008.

(56) References Cited

U.S. PATENT DOCUMENTS

| | | |
|---|---|---|
| 5,126,007 A | 6/1992 | Shmulovich |
| 5,386,219 A | 1/1995 | Greanias et al. |
| 5,492,611 A | 2/1996 | Sugama et al. |
| 5,512,131 A | 4/1996 | Kumar et al. |
| 6,137,427 A | 10/2000 | Binstead |
| 6,188,391 B1 | 2/2001 | Seely et al. |
| 6,297,811 B1 | 10/2001 | Kent et al. |
| 6,472,804 B2 | 10/2002 | Mueller et al. |
| 6,549,193 B1 | 4/2003 | Huang et al. |
| 6,775,907 B1 | 8/2004 | Boyko et al. |
| 6,919,881 B2 | 7/2005 | Chou |
| 7,129,935 B2 | 10/2006 | Mackey |
| 7,196,281 B2 | 3/2007 | Cok et al. |
| 7,202,859 B1 | 4/2007 | Speck |
| 7,265,686 B2 | 9/2007 | Hurst et al. |
| 7,327,352 B2 | 2/2008 | Keefer |
| 7,339,579 B2 | 3/2008 | Richter et al. |
| 7,393,472 B2 | 7/2008 | Lee et al. |
| 7,439,963 B2 | 10/2008 | Geaghan et al. |
| 7,737,617 B2 | 6/2010 | Miyazaki et al. |
| 7,820,078 B2 | 10/2010 | Louwet |
| 7,968,804 B2 | 6/2011 | Frey et al. |
| 8,603,611 B2 | 12/2013 | Wakabayashi et al. |
| 8,619,039 B2 | 12/2013 | Yang et al. |
| 2002/0130605 A1 | 9/2002 | Mueller et al. |
| 2003/0047535 A1 | 3/2003 | Schueller et al. |
| 2003/0067451 A1 | 4/2003 | Tagg et al. |
| 2003/0222857 A1 | 12/2003 | Abileah |
| 2003/0234770 A1 | 12/2003 | Mackey |
| 2004/0012570 A1 | 1/2004 | Cross et al. |
| 2004/0188150 A1 | 9/2004 | Richard et al. |
| 2004/0265550 A1 | 12/2004 | Glatkowski et al. |
| 2005/0003590 A1 | 1/2005 | Blees et al. |
| 2005/0041018 A1 | 2/2005 | Philipp |
| 2005/0076824 A1 | 4/2005 | Cross |
| 2005/0153078 A1 | 7/2005 | Bentley |
| 2005/0186405 A1 | 8/2005 | Jeong et al. |
| 2006/0007171 A1 | 1/2006 | Burdi |
| 2006/0012575 A1 | 1/2006 | Knapp et al. |
| 2006/0097991 A1 | 5/2006 | Hotelling et al. |
| 2006/0278444 A1 | 12/2006 | Binstead |
| 2007/0018076 A1 | 1/2007 | Chen et al. |
| 2007/0059901 A1 | 3/2007 | Majumdar et al. |
| 2007/0074914 A1 | 4/2007 | Geaghan et al. |
| 2007/0128905 A1 | 6/2007 | Speakman |
| 2007/0160811 A1 | 7/2007 | Gaides et al. |
| 2007/0181878 A1 | 8/2007 | Song et al. |
| 2007/0200099 A1 | 8/2007 | Lee et al. |
| 2007/0236618 A1 | 10/2007 | Maag et al. |
| 2007/0242054 A1 | 10/2007 | Chang et al. |
| 2007/0247443 A1 | 10/2007 | Philipp |
| 2008/0041641 A1 | 2/2008 | Geaghan et al. |
| 2008/0062148 A1 | 3/2008 | Hotelling et al. |
| 2008/0095985 A1 | 4/2008 | Frey et al. |
| 2008/0095988 A1 | 4/2008 | Frey et al. |
| 2008/0150148 A1 | 6/2008 | Frey et al. |
| 2008/0158183 A1 | 7/2008 | Hotelling et al. |
| 2009/0002337 A1 | 1/2009 | Chang |
| 2009/0135146 A1 | 5/2009 | Scholz |
| 2009/0159344 A1 | 6/2009 | Hotelling |
| 2009/0160783 A1 | 6/2009 | Yang |
| 2009/0163256 A1 | 6/2009 | Wienke |
| 2009/0165296 A1 | 7/2009 | Carmi |
| 2010/0220074 A1 | 9/2010 | Irvin, Jr. et al. |
| 2011/0102361 A1 | 5/2011 | Philipp |
| 2012/0046887 A1 | 2/2012 | XiaoPing |

FOREIGN PATENT DOCUMENTS

| | | |
|---|---|---|
| JP | 2126314 | 5/1990 |
| JP | H02-126315 | 5/1990 |
| JP | 2000-081510 | 3/2001 |
| JP | 2002-014772 | 1/2002 |
| JP | 2004-192093 | 7/2004 |
| JP | 2005-084475 | 3/2005 |
| JP | 2005-352638 | 12/2005 |
| JP | 2006-344163 | 12/2006 |
| JP | 20070482878 | 2/2007 |
| KR | 10-2007-0012276 | 1/2007 |
| KR | 10-0797092 | 1/2008 |
| WO | WO 01/88998 | 11/2001 |
| WO | WO 2005/035438 A1 | 4/2005 |
| WO | WO 2005/0114369 | 12/2005 |
| WO | WO 2005/121940 | 12/2005 |
| WO | WO 2009/089199 | 7/2009 |

OTHER PUBLICATIONS

Love et al., "Self-Assembled Monolayers of Thiolates on Metals as a Form of Nanotechnology", *Chemical Reviews*, vol. 105, pp. 1103-1169 (2005).

Wayback Machine Internet Archive Entry of Conductive Inkjet Technology, Micro file Laser Curing, Aug. 27, 2006.

Lennhoff, "Laser Patterning for Touch Screen Manufacture", 2005, 3M Touch Systems, PWE1.

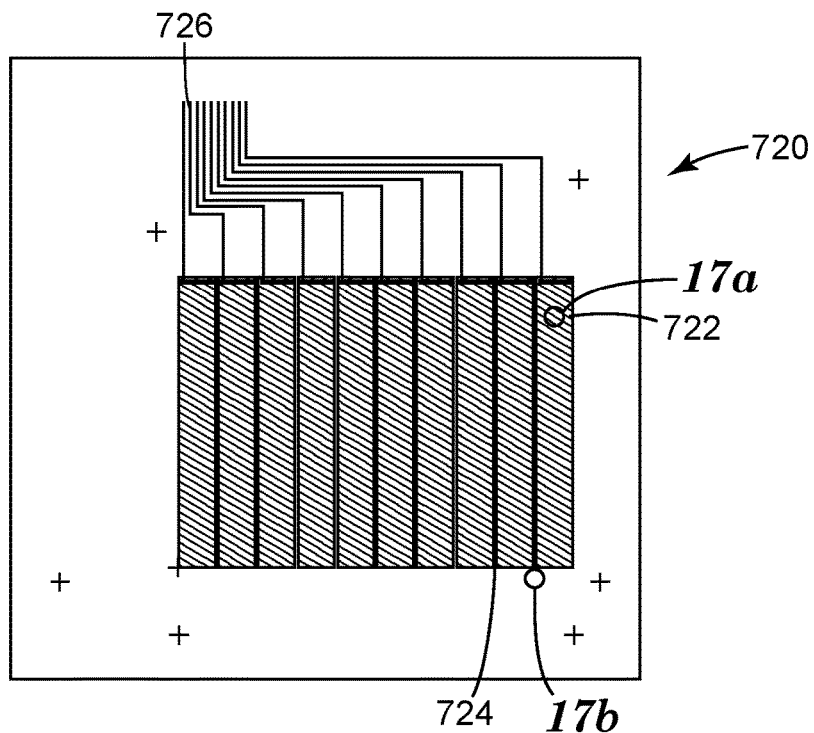
Fig. 17
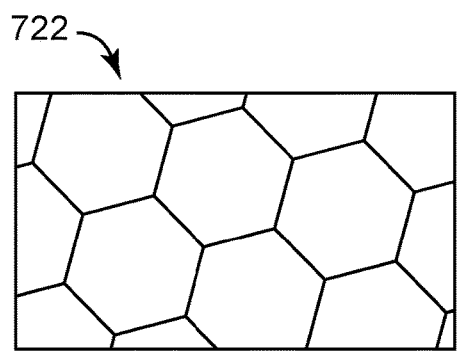 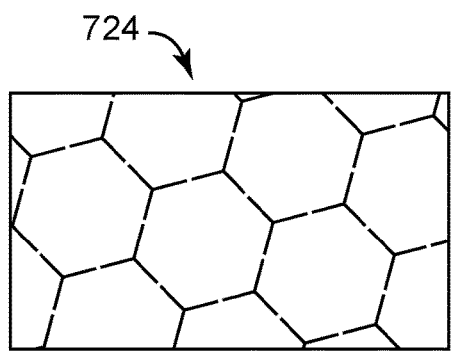
Fig. 17a  Fig. 17b

TOUCH SCREEN SENSOR

BACKGROUND

Touch screen sensors detect the location of an object (for example a finger or a stylus) applied to the surface of a touch screen display or the location of an object positioned near the surface of a touch screen display. These sensors detect the location of the object along the surface of the display, for example in the plane of a flat rectangular display. Examples of touch screen sensors include capacitive sensors, resistive sensors, and projected capacitive sensors. Such sensors include transparent conductive elements that overlay the display. The elements are combined with electronic components that use electrical signals to probe the elements in order to determine the location of an object near or in contact with the display.

In the field of touch screen sensors, there is a need to have improved control over the electrical properties of the transparent touch screen sensors, without compromising optical quality or properties of the display. A transparent conductive region of a typical touch screen sensor includes a continuous coating of a transparent conducting oxide (TCO) such as indium tin oxide (ITO), the coating exhibiting electrical potential gradients based on the location or locations of contact to a voltage source and the overall shape of the region. This fact leads to a constraint on possible touch sensor designs and sensor performance, and necessitates such measures as expensive signal processing electronics or placement of additional electrodes to modify the electrical potential gradients. Thus, there is a need for transparent conductive elements that offer control over electrical potential gradients that is independent of the aforementioned factors.

There is an additional need in the field of touch screen sensors that relates to flexibility in the design of electrically conductive elements. The fabrication of touch screen sensors using patterned transparent conducting oxides (TCO) such as indium tin oxide (ITO) often places limitations on conductor design. The limitations relate to a constraint caused by patterning all of the conductive elements from a transparent sheet conductor that has a single value of isotropic sheet resistance.

BRIEF SUMMARY

The present disclosure relates to touch screen sensors having varying sheet resistance. In a first embodiment, a touch screen sensor includes a visible light transparent substrate and an electrically conductive micropattern disposed on or in the visible light transparent substrate. The micropattern includes a first region micropattern within a touch sensing area and a second region micropattern. The first region micropattern has a first sheet resistance value in a first direction, is visible light transparent, and has at least 90% open area. The second region micropattern has a second sheet resistance value in the first direction. The first sheet resistance value is different from the second sheet resistance value.

In another embodiment, a touch screen sensor includes a visible light transparent substrate and an electrically conductive micropattern disposed on or in the visible light transparent substrate. The micropattern includes a first region micropattern within a touch sensing area, the first region micropattern having an anisotropic first sheet resistance, being visible light transparent, and having at least 90% open area.

In another embodiment, a touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern has metallic linear electrically conductive features with a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction. The first sheet resistance value is different from the second sheet resistance value.

In a further embodiment, a touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area.

BRIEF DESCRIPTION OF THE DRAWINGS

The invention may be more completely understood in consideration of the following detailed description of various embodiments of the invention in connection with the accompanying drawings, in which:

FIGS. 17, 17a, and 17b illustrate various portions of a second patterned substrate;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
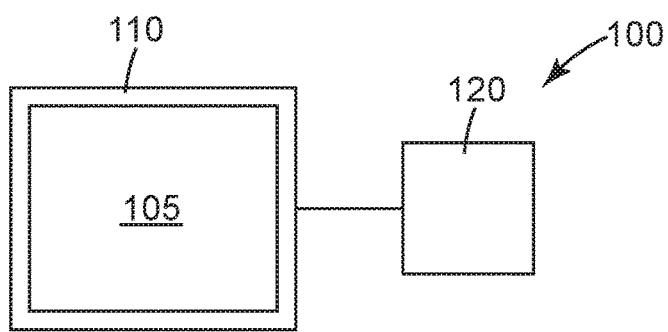
FIG. 1 illustrates a schematic diagram of a touch screen sensor 100.

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers within that range (e.g., 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the context clearly dictates otherwise. As used in this specification and the appended claims, the term "or" is generally employed in its sense including "and/or" unless the context clearly dictates otherwise.

As used herein, "visible light transparent" refers to the level of transmission being at least 60 percent transmissive to at least one polarization state of visible light, where the percent transmission is normalized to the intensity of the incident, optionally polarized light. It is within the meaning of visible light transparent for an article that transmits at least 60 percent of incident light to include microscopic features (e.g., dots, squares, or lines with minimum dimension, for example width, between 0.5 and 10 micrometers, or between 1 and 5 micrometers) that block light locally to less than 80 percent transmission (e.g., 0 percent); however, in such cases, for an approximately equiaxed area including the microscopic feature and measuring 1000 times the minimum dimension of the microscopic feature in width, the average transmittance is greater than 60 percent.

The present disclosure relates to touch screen sensors with electrical and optical properties that are engineered through design of conductor micropatterns comprised therein. There are several advantages that are created for touch screen sensors by the incorporation of the conductor micropatterns described herein.

In some embodiments, the transparent conductive properties within a transparent conductive region are engineered to control the electrical potential gradient within the touch sensing region during use. This leads to simplicity of signal processing electronics and, for some touch screen sensor types simplicity in the design of (or elimination of the need for) additional conductor patterns that would otherwise be needed for electrical potential gradient (electrical field) linearization.

In some embodiments, the electrical properties of the touch screen sensors described herein are designed to generate a controlled electrical potential gradient along a transparent sensor element. For example, the electrical properties are designed to create a linear electrical potential gradient along a particular direction within a transparent conductive region, the overall shape of which would ordinarily lead to a non-linear gradient if a standard transparent conductor material was used (e.g., continuous ITO coating).

In some embodiments, the electrical properties are designed to create a level of non-linearity of electrical potential gradient for a transparent conductive region that is greater than that which would be present within a transparent conductive region of the same shape but comprised of a standard transparent conductor material (e.g., continuous ITO coating). In more detail, for a rectangular capacitive touch screen comprising a contiguous transparent sheet conductor in the form of a micropatterned conductor with electrical connections made to the corners of the sensing area, the linearity of electrical potential gradient (and uniformity of electric field) across the sensing area in the vertical and horizontal directions can be improved by engineering the area distribution of sheet resistance values and anisotropy in such a way as to distribute the field more uniformly.

In other embodiments, the sensor includes conductor elements comprised of the same conductor material at the same thickness (i.e., height), but with different effective sheet resistance by virtue of micropatterning. For example, in some embodiments, the same conductor material at the same thickness (i.e., height) is used to generate conductive traces that define a first micropattern geometry, leading to a first level of sheet resistance in a transparent conductive region, and conductive traces that define a second micropattern geometry, leading to a second level of sheet resistance in a second transparent conductive region.

This disclosure also allows for improved efficiency and resource utilization in the manufacture of transparent display sensors, for example through the avoidance of rare elements such as indium for some embodiments, for example embodiments based on micropatterned metal conductors.

The disclosure further relates to contact or proximity sensors for touch input of information or instructions into electronic devices (e.g., computers, cellular telephones, etc.). These sensors are visible light transparent and useful in direct combination with a display, overlaying a display element, and interfaced with a device that drives the display (as a "touch screen" sensor). The sensor element has a sheet like form and includes at least one electrically insulating visible light transparent substrate layer that supports one or more of the following: i) conductive material (e.g., metal) that is mesh patterned onto two different regions of the substrate surface with two different mesh designs so as to generate two regions with different effective sheet resistance values, where at least one of the regions is a transparent conductive region that lies within the touch-sensing area of the sensor; ii) conductive material (e.g., metal) that is patterned onto the surface of the substrate in a mesh geometry so as to generate a transparent conductive region that lies within the touch sensing area of the sensor and that exhibits anisotropic effective sheet resistance; and/or iii) conductive material (e.g., metal) that is patterned onto the surface of the substrate in a mesh geometry within an effectively electrically continuous transparent conductive region, the geometry varying within the region so as to generate different values of local effective sheet resistance in at least one direction (e.g., continuously varying sheet resistance for the transparent conductive region), where the region lies within the sensing area of the touch sensor.

The sensing area of a touch sensor is that region of the sensor that is intended to overlay, or that overlays, a viewable portion of an information display and is visible light transparent in order to allow viewability of the information display. Viewable portion of the information display refers to that portion of an information display that has changeable information content, for example the portion of a display "screen" that is occupied by pixels, for example the pixels of a liquid crystal display.

This disclosure further relates to touch screen sensors that are of the resistive, capacitive, and projected capacitive types. The visible light transparent conductor micropatterns are particularly useful for projected capacitive touch screen sensors that are integrated with electronic displays. As a component of projected capacitive touch screen sensors, the visible light transparent conductive micropattern are useful for enabling high touch sensitivity, multi-touch detection, and stylus input.

The two or more different levels of sheet resistance, the anisotropy of the sheet resistance, or the varying level of sheet resistance within a transparent conductive region can be controlled by the geometries of two-dimensional meshes that make up the transparent micropatterned conductors, as described below.

While the present invention is not so limited, an appreciation of various aspects of the invention will be gained through a discussion of the examples provided below.

FIG. 1 illustrates a schematic diagram of a touch screen sensor 100. The touch screen sensor 100 includes a touch screen panel 110 having a touch sensing area 105. The touch sensing area 105 is electrically coupled to a touch sensor drive device 120. The touch screen panel 110 is incorporated into a display device.

Figure 2:
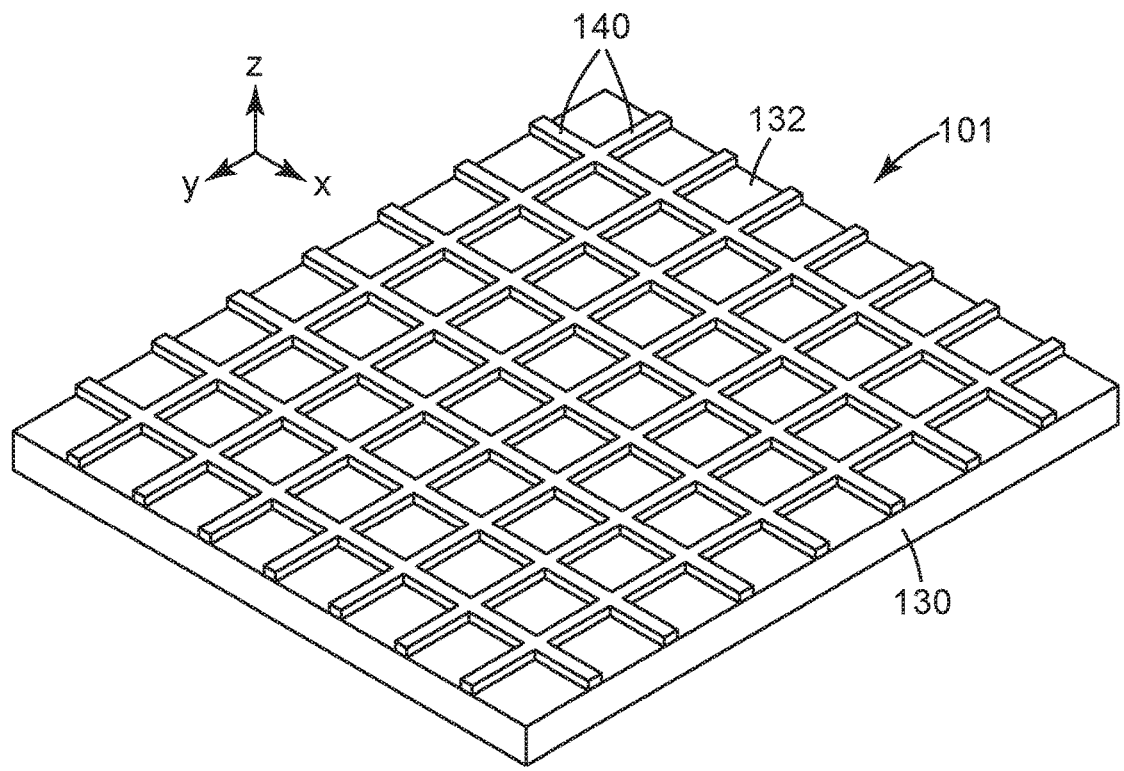
FIG. 2 illustrates a perspective view of a conductive visible light transparent region lying within a touch screen sensing area.

FIG. 2 illustrates a perspective view of a conductive visible light transparent region 101 that would lie within a touch sensing area of a touch screen panel, e.g., touch sensing area 105 in FIG. 1. The conductive visible light transparent region 101 includes a visible light transparent substrate 130 and an electrically conductive micropattern 140 disposed on or in the visible light transparent substrate 130. The visible light transparent substrate 130 includes a major surface 132 and is electrically insulating. The visible light transparent substrate 130 can be formed of any useful electrically insulating material such as, for example, glass or polymer. Examples of useful polymers for light transparent substrate 130 include polyethylene terephthalate (PET) and polyethylene naphthalate (PEN). The electrically conductive micropattern 140 can be formed of a plurality of linear metallic features.

FIG. 2 also illustrates an axis system for use in describing the conductive visible light transparent region 101 that would lie within a touch sensing area of a touch screen panel. Generally, for display devices, the x and y axes correspond to the width and length of the display and the z axis is typically along the thickness (i.e., height) direction of a display. This convention will be used throughout, unless otherwise stated. In the axis system of FIG. 2, the x axis and y axis are defined to be parallel to a major surface 132 of the visible light transparent substrate 130 and may correspond to width and length directions of a square or rectangular surface. The z axis is perpendicular to that major surface and is typically along the thickness direction of the visible light transparent substrate 130. A width of the plurality of linear metallic features that form the electrically conductive micropattern 140 correspond to an x-direction distance for the parallel linear metallic features that extend linearly along the y axis and a y-direction distance for the orthogonal linear metallic features correspond to a width of the orthogonal linear metallic features. A thickness or height of the linear metallic features corresponds to a z-direction distance.

In some embodiments, the conductive visible light transparent region 101 that would lie within a touch sensing area of a touch screen panel includes two or more layers of visible light transparent substrate 130 each having a conductive micropattern 140.

The conductive micropattern 140 is deposited on the major surface 132. Because the sensor is to be interfaced with a display to form a touch screen display, or touch panel display, the substrate 130 is visible light transparent and substantially planar. The substrate and the sensor may be substantially planar and flexible. By visible light transparent, what is meant is that information (for example, text, images, or figures) that is rendered by the display can be viewed through the touch sensor. The viewability and transparency can be achieved for touch sensors including conductors in the form of a deposited metal, even metal that is deposited with thickness great enough to block light, if the metal is deposited in an appropriate micropattern.

The conductive micropattern 140 includes at least one visible light transparent conductive region overlaying a viewable portion of the display that renders information. By visible light transparent conductive, what is meant is that the portion of the display can be viewed through the region of conductive micropattern and that the region of micropattern is electrically conductive in the plane of the pattern, or stated differently, along the major surface of the substrate onto which the conductive micropattern is deposited and to which it is adjacent. Preferred conductive micropatterns include regions with two dimensional meshes, for example square grids, rectangular (non-square) grids, or regular hexagonal networks, where conductive traces define enclosed open areas within the mesh that are not deposited with conductor that is in electrical contact with the traces of the mesh. The open spaces and associated conductor traces at their edges are referred to herein as cells. Other useful geometries for mesh cells include random cell shapes and irregular polygons.

In some embodiments, the conductive traces defining the conductive micropattern are designed not to include segments that are approximately straight for a distance greater than the combined edge length of five adjacent cells, preferably four adjacent cells, more preferably three adjacent cells, even more preferably two adjacent cells. Most preferably, the traces defining the micropattern are designed not to include segments that are straight for a distance greater than the edge length of a single cell. Accordingly, in some embodiments, the traces that define the micropattern are not straight over long distances, for example, 10 centimeters, 1 centimeter, or even 1 mm. Patterns with minimal lengths of straight line segments, as just described, are particularly useful for touch screen sensors with the advantage of causing minimal disturbance of display viewability.

The two-dimensional geometry of the conductive micropattern (that is, geometry of the pattern in the plane or along the major surface of the substrate) can be designed, with consideration of the optical and electrical properties of the conductor material, to achieve special transparent conductive properties that are useful in touch screen sensors. For example, whereas a continuous (un-patterned) deposit or coating of conductor material has a sheet resistance that is calculated as its bulk resistivity divided by its thickness, in the present invention different levels of sheet resistance is engineered by micropatterning the conductor as well.

In some embodiments, the two-dimensional conductive micropattern is designed to achieve anisotropic sheet resistance in a conductive region (for example, a visible light transparent conductive region) of the sensor. By anisotropic sheet resistance, what is meant is that the magnitude of the sheet resistance of the conductive micropattern is different when measured or modeled along two orthogonal directions.

In contrast, in some embodiments, the two-dimensional conductive micropattern is designed to achieve isotropic sheet resistance in a conductive region (for example, a visible light transparent conductive region) of the sensor. By isotropic sheet resistance, what is meant is that the magnitude of the sheet resistance of the conductive micropattern is the same when measured or modeled along any two orthogonal directions in the plane, as in the case for a square grid having formed with traces of constant width for both directions.

Anisotropic sheet resistance within a region can include sheet resistance in one direction that is at least 10 percent greater than the sheet resistance in the orthogonal direction, or at least 25 percent greater, at least 50 percent greater, at least 100 percent greater, at least 200 percent greater, at least 500 percent greater, or even at least 10 times greater. In some embodiments, anisotropic sheet resistance within a region includes sheet resistance in one direction that is greater than the sheet resistance in the orthogonal direction by a factor of at least 1.5. In some embodiments, anisotropic sheet resistance within a region includes sheet resistance in one direction that is greater than the sheet resistance in the orthogonal direction by a factor between 1.1 and 10, in other embodiments between 1.25 and 5, and in yet other embodiments between 1.5 and 2.

An example of a conductive micropattern geometry that can generate anisotropic sheet resistance is approximately a rectangular microgrid (non-square) with fixed widths for the conductive traces. For such a rectangular microgrid (non-square), anisotropic sheet resistance can result from a repeating geometry for the cells of the grid that includes one edge that is 10 percent longer than the other, 25 percent longer than the other, at least 50 percent longer than the other, 100 percent longer than the other, or even 10 times longer than the other. Anisotropic sheet resistance can be created by varying the width of traces for different directions, for example in an otherwise highly symmetrical pattern of cells for a mesh. An example of the latter approach to generating anisotropic sheet resistance is a square grid of conductive traces, for example with pitch of 200 micrometers, wherein the traces in a first direction are 10 micrometers wide and the traces in the orthogonal direction are 9 micrometers in width, 7.5 micrometers in width, 5 micrometers in width, or even 1 micrometer in width. Anisotropic sheet resistance within a region can include a finite, measurable sheet resistance in one direction and essentially infinite sheet resistance in the other direction, as would be generated by a pattern of parallel conductive lines. In some embodiments, as described above, the anisotropic sheet resistance within a region includes a finite, measurable sheet resistance in a first direction and a finite, measurable sheet resistance in the direction orthogonal to the first direction.

For the purpose of determining whether a region of conductive micropattern is isotropic or anisotropic, it will be appreciated by those skilled in the art that the scale of the region of interest must be reasonably selected, relative to the scale of the micropattern, to make relevant measurements or calculations of properties. For example, once a conductor is patterned at all, it is trivial for one to select a location and a scale on which to make a measurement that will yield a difference in sheet resistance for different directions of measurement. The following detailed example can make the point more clearly. If one considered a conductor pattern of isotropic geometry in the form of a square grid with 100 micrometer wide conductor traces and 1 mm pitch (leading to 900 micrometer by 900 micrometer square openings in the grid), and one made four point probe measurements of sheet resistance within one of the traces along the edge of a square opening with a probe having fixed spacing along the four linearly arranged probes of 25 micrometers (leading to a separation between the two current probes, the outside probes, of 75 micrometers), different levels of sheet resistance will be calculated by the measured values of current and voltage depending on whether the probes were aligned parallel to the trace or orthogonal to the trace. Thus, even though the square grid geometry would yield isotropic sheet resistance on a scale larger than the square grid cell size, it is possible for one to carry out measurements of sheet resistance that would suggest anisotropy. Thus, for the purpose of defining anisotropy of the sheet resistance of a conductive micropattern in the current disclosure, for example a visible light transparent conductive region of the micropattern that comprises a mesh, the relevant scale over which the sheet resistance should be measured or modeled is greater than the length scale of a cell in the mesh, preferably greater than the length scale of two cells. In some cases, the sheet resistance is measured or modeled over the length scale of five or more cells in the mesh, to show that the mesh is anisotropic in its sheet resistance.

In contrast to embodiments where the conductive micropattern exhibits anisotropy of sheet resistance in a region, sensors including transparent conducting oxide thin films (for example, indium tin oxide, or ITO) exhibit isotropic sheet resistance in contiguous regions of the conductor. In the latter case, one can measure or model that as four-point probe measurements of sheet resistance of a contiguous region are made in different directions and with decreasing spacing between the probes, the same readings of current and voltage for different directions clearly indicate isotropy.

In some embodiments, the two-dimensional conductive micropattern is designed to achieve different levels, or magnitudes, of sheet resistance in two different patterned conductor regions of the sensor, when measured in a given direction. For example, with respect to the different levels of sheet resistance, the greater of the two may exceed the lesser by a factor greater than 1.25, a factor greater than 1.5, a factor greater than 2, a factor greater than 5, a factor greater than 10, or even a factor greater than 100. In some embodiments, the greater of the two sheet resistance values exceeds the lesser by a factor between 1.25 and 1000, in other embodiments between 1.25 and 100, in other embodiments between 1.25 and 10, in other embodiments between 2 and 5. For a region to be regarded as having a different sheet resistance from that of another region, it would have a sheet resistance that is greater or lesser than that of the other region by a factor of at least 1.1.

In some embodiments, the micropattern is designed to achieve the aforementioned different levels of sheet resistance for two patterned conductor regions that are electrically contiguous, which is to say that they are patterned conductor regions that are in electrical contact with each other along a boundary between them. Each of the two patterned conductor regions that share a conductive boundary may have uniform respective pattern geometries, but again different. In some embodiments, the micropattern is designed to achieve the different levels of sheet resistance for two different patterned conductor regions that are electrically noncontiguous, which is to say that the they are patterned conductor regions that share no boundary between them for which the patterned regions are in electrical contact along that boundary. Each of the two patterned conductor regions that share no conductive boundary between them may have uniform respective pattern geometries, but again different. For electrically noncontiguous regions, it is within the scope of the disclosure for them both to make electrical contact in the pattern to the same solid conductor element, for example a bus bar or pad. In some embodiments, the micropattern is designed to achieve the different levels of sheet resistance for two regions that are electrically isolated from each other and thus can be addressed independently by electrical signals. Each of the two mesh regions that are electrically isolated may have a uniform pattern geometry, but again different. Finally, in some embodiments, the micropattern is designed to achieve different levels of sheet resistance for two different regions by creating continuously varying sheet resistance from the first region to the second, and example of two regions that are electrically contiguous.

The two dimensional conductive micropatterns that include two regions with different sheet resistance in a measurement direction are useful for designing a visible light transparent conductive region in the sensing area with a preferred level of sheet resistance for that region (for example, low sheet resistance between 5 and 100 ohms per square), including varying or anisotropic sheet resistance optionally, and designing an electrical element, for example a resistor element, as part of the touch screen sensor that may or may not lie within the sensing area, the resistor element comprising a sheet conductor with sheet resistance selected optimally for the resistor function (for example, higher sheet resistance between 150 and 1000 ohms per square) and possibly in light of other design constraints, for example the constraint of minimizing the footprint of the resistor.

The sheet resistance of the conductive micropattern, in regions and directions with finite sheet resistance that can be measured or modeled, as described above, may fall within the range of 0.01 ohms per square to 1 megaohm per square, or within the range of 0.1 to 1000 ohms per square, or within the range of 1 to 500 ohms per square. In some embodiments, the sheet resistance of the conductive micropattern falls within the range of 1 to 50 ohms per square. In other embodiments, the sheet resistance of the conductive micropattern falls within the range of 5 to 500 ohms per square. In other embodiments, the sheet resistance of the conductive micropattern falls within the range of 5 to 100 ohms per square. In other embodiments, the sheet resistance of the conductive micropattern falls within the range of 5 to 40 ohms per square. In other embodiments, the sheet resistance of the conductive micropattern falls within the range of 10 to 30 ohms per square. In prescribing the sheet resistance that may characterize a conductive micropattern or a region of a conductive micropattern, the micropattern or region of micropattern is said to have a sheet resistance of a given value if it has that sheet resistance value for electrical conduction in any direction.

Appropriate micropatterns of conductor for achieving transparency of the sensor and viewability of a display through the sensor have certain attributes. First of all, regions of the conductive micropattern through which the display is to be viewed should have area fraction of the sensor that is shadowed by the conductor of less than 50%, or less than 25%, or less than 20%, or less than 10%, or less than 5%, or less than 4%, or less than 3%, or less than 2%, or less than 1%, or in a range from 0.25 to 0.75%, or less than 0.5%.

The open area fraction (or open area) of a conductive micropattern, or region of a conductive micropattern, is the proportion of the micropattern area or region area that is not shadowed by the conductor. The open area is equal to one minus the area fraction that is shadowed by the conductor, and may be expressed conveniently, and interchangeably, as a decimal or a percentage. Thus, for the values given in the above paragraph for the fraction shadowed by conductor, the open area values are greater than 50%, greater than 75%, greater than 80%, greater than 90%, greater than 95%, greater than 96%, greater than 97%, greater than 98%, greater than 99%, 99.25 to 99.75%, and greater than 99.5%. In some embodiments, the open area of a region of the conductor micropattern (for example, a visible light transparent conductive region) is between 80% and 99.5%, in other embodiments between 90% and 99.5%, in other embodiments between 95% and 99%, in other embodiments between 96% and 99.5%, and in other embodiments between 97% and 98%. With respect to the reproducible achievement of useful optical properties (for example high transmission and invisibility of conductive pattern elements) and electrical properties, using practical manufacturing methods, preferred values of open area are between 90 and 99.5%, more preferably between 95 and 99.5%, most preferably between 95 and 99%.

To minimize interference with the pixel pattern of the display and to avoid viewability of the pattern elements (for example, conductor lines) by the naked eye of a user or viewer, the minimum dimension of the conductive pattern elements (for example, the width of a line or conductive trace) should be less than or equal to approximately 50 micrometers, or less than or equal to approximately 25 micrometers, or less than or equal to approximately 10 micrometers, or less than or equal to approximately 5 micrometers, or less than or equal to approximately 4 micrometers, or less than or equal to approximately 3 micrometers, or less than or equal to approximately 2 micrometers, or less than or equal to approximately 1 micrometer, or less than or equal to approximately 0.5 micrometer.

In some embodiments, the minimum dimension of conductive pattern elements is between 0.5 and 50 micrometers, in other embodiments between 0.5 and 25 micrometers, in other embodiments between 1 and 10 micrometers, in other embodiments between 1 and 5 micrometers, in other embodiments between 1 and 4 micrometers, in other embodiments between 1 and 3 micrometers, in other embodiments between 0.5 and 3 micrometers, and in other embodiments between 0.5 and 2 micrometers. With respect to the reproducible achievement of useful optical properties (for example high transmission and invisibility of conductive pattern elements with the naked eye) and electrical properties, and in light of the constraint of using practical manufacturing methods, preferred values of minimum dimension of conductive pattern elements are between 0.5 and 5 micrometers, more preferably between 1 and 4 micrometers, and most preferably between 1 and 3 micrometers.

In general, the deposited electrically conductive material reduces the light transmission of the touch sensor, undesirably. Basically, wherever there is electrically conductive material deposited, the display is shadowed in terms of its viewability by a user. The degree of attenuation caused by the conductor material is proportional to the area fraction of the sensor or region of the sensor that is covered by conductor, within the conductor micropattern.

In some embodiments, in order to generate a visible light transparent display sensor that has uniform light transmission across the viewable display field, even if there is a non-uniform distribution of sheet resistance, for example derived from a non-uniform mesh of conductive material, the sensors include isolated conductor deposits added to the conductor micropattern that serve to maintain the uniformity of light transmittance across the pattern. Such isolated conductor deposits are not connected to the drive device (for example, electrical circuit or computer) for the sensor and thus do not serve an electrical function. For example, a metal conductor micropattern that includes a first region with a mesh of square grid geometry of 3 micrometer line width and 200 micrometer pitch (3 percent of the area is shadowed by the metal, i.e., 97% open area) and second region with a mesh of square grid geometry of 3 micrometer line width and 300 micrometer pitch (2 percent of the area is shadowed by the metal, i.e., 98% open area) can be made optically uniform in its average light transmission across the two regions by including within each of the open cells of the 300 micrometer pitch grid region one hundred evenly spaced 3 micrometer by 3 micrometer squares of metal conductor in the pattern. The one hundred 3 micrometer by 3 micrometer squares (900 square micrometers) shadow an additional 1 percent of the area for each 300 micrometer by 300 micrometer cell (90000 square micrometers), this making the average light transmission of the second region equal to that of the first region. Similar isolated metal features can be added in regions of space between contiguous transparent conductive regions, for example contiguous transparent conductive regions that include micropatterned conductor in the form of a two dimensional meshes or networks, in order to maintain uniformity of light transmittance across the sensor, including the transparent conductive regions and the region of space between them. In addition to isolated squares of conductor, other useful isolated deposits of conductor for tailoring optical uniformity include circles and lines. The minimum dimension of the electrically isolated deposits (e.g., the edge length of a square feature, the diameter of a circular feature, or the width of a linear feature) is less than 10 micrometers, less than 5 micrometers, less than 2 micrometers, or even less than 1 micrometer.

With respect to the reproducible achievement of useful optical properties (for example high transmission and invisibility of conductive pattern elements), using practical manufacturing methods, the minimum dimension of the electrically isolated deposits is preferably between 0.5 and 10 micrometers, more preferably between 0.5 and 5 micrometers, even more preferably between 0.5 and 4 micrometers, even more preferably between 1 and 4 micrometers, and most preferably between 1 and 3 micrometers. In some embodiments, the arrangement of electrically isolated conductor deposits is designed to lack periodicity. A lack of periodicity is preferred for limiting unfavorable visible interactions with the periodic pixel pattern of an underlying display. For an ensemble of electrically isolated conductor deposits to lack periodicity, there need only be a single disruption to the otherwise periodic placement of at least a portion of the deposits, across a region having the deposits and lacking micropattern elements that are connected to decoding or signal generation and/or processing electronics. Such electrically isolated conductor deposits are said to have an aperiodic arrangement, or are said to be an aperiodic arrangement of electrically isolated conductor deposits. In some embodiments, the electrically isolated conductor deposits are designed to lack straight, parallel edges spaced closer than 10 micrometers apart, for example as would exist for opposing faces of a square deposit with edge length of 5 micrometers. More preferably the isolated conductor deposits are designed to lack straight, parallel edges spaced closer than 5 micrometers apart, more preferably 4 micrometers apart, even more preferably 3 micrometers apart, even more preferably 2 micrometers apart. Examples of electrically isolated conductor deposits that lack straight, parallel edges are ellipses, circles, pentagons, heptagons, and triangles. The absence within the design of electrically isolated conductor deposits of straight, parallel edges serves to minimize light-diffractive artifacts that could disrupt the viewability of a display that integrates the sensor.

The impact of the conductor micropattern on optical uniformity can be quantified. If the total area of the sensor, and hence the conductor micropattern, that overlays a viewable region of the display is segmented into an array of 1 mm by 1 mm regions, preferred sensors include conductor micropatterns wherein none of the regions have a shadowed area fraction that differs by greater than 75 percent from the average for all of the regions. More preferably, none have a shadowed area fraction that differs by greater than 50 percent. More preferably, none have a shadowed area fraction that differs by greater than 25 percent. Even more preferably, none have a shadowed area fraction that differs by greater than 10 percent. If the total area of the sensor, and hence the conductor micropattern, that overlays a viewable region of the display is segmented into an array of 5 mm by 5 mm regions, preferred sensors include conductor micropatterns wherein none of the regions have a shadowed area fraction that differs by greater than 50 percent from the average for all of the regions. Preferably, none have a shadowed area fraction that differs by greater than 50 percent. More preferably, none have a shadowed area fraction that differs by greater than 25 percent. Even more preferably, none have a shadowed area fraction that differs by greater than 10 percent.

The disclosure advantageously allows for the use of metals as the conductive material in a transparent conductive sensor, as opposed to transparent conducting oxides (TCO's), such as ITO. ITO has certain drawbacks, such as corrosion-related degradation in certain constructions, a tendency to crack when flexed, high attenuation of transmitted light (due to reflection and absorption) when deposited as a coating with sheet resistance below 100 to 1000 ohms per square, and increasing cost due to the scarcity of indium. ITO is also difficult to deposit with uniform and reproducible electrical properties, leading to the need for more complex and expensive electronics that couple to the conductive pattern to construct a touch screen sensor.

Examples of useful metals for forming the electrically conductive micropattern include gold, silver, palladium, platinum, aluminum, copper, nickel, tin, alloys, and combinations thereof. In some embodiments, the conductor is a transparent conducting oxide. In some embodiments the conductor is ITO. The conductor may have a thickness between 5 nanometers and 5 micrometers, or between 10 nanometers and 500 nanometers, or between 15 nanometers and 250 nanometers. In many embodiments, the thickness of the conductor is less than one micrometer. A desired thickness for the conductor can be calculated by starting with the desired sheet resistance and considering the micropattern geometry (and in turn its effect on the current-carrying cross-section in the plane) and the bulk resistivity of the conductor, as is known in the art. For complicated geometries of micropattern, there are computational methods in the art, for example finite difference methods or finite element methods that can be used to calculate sheet resistance, referred to herein as modeling the properties of a micropattern. Sheet resistance can be measured using a number of techniques, including four-point probe techniques and non-contact eddy-current methods, as are known in the art.

Examples of useful displays with which sensors of the invention can be integrated include liquid crystal displays, cathode ray tube displays, plasma display panels, organic light emitting diode displays.

Conductor patterns according to the invention can be generated by any appropriate patterning method, for example methods that include photolithography with etching or photolithography with plating (see, e.g., U.S. Pat. No. 5,126,007; U.S. Pat. No. 5,492,611; U.S. Pat. No. 6,775, 907).

In some embodiments, transparent conductive regions with different sheet resistance in at least one direction are created by including selective breaks in conductive traces within an otherwise continuous and uniform mesh. This approach of selective placement of breaks is especially useful for generating articles including patterns of visible transparent conductive regions where the optical transmittance across the article is uniform. The starting mesh can be isotropic or anisotropic. For example, an elongated rectangular transparent conductive bar having a square micromesh can be made to exhibit periodic sheet resistance along its long axis by creating a periodic series of breaks, the breaks being in traces that have a vector component in the direction of the long axis and the periodicity being in the direction of the long axis. This periodicity in sheet resistance can be useful for decoding the position of an object (e.g., a finger) near the rectangular bar. By selecting the width, thickness, and area density of traces, together with the population of breaks, one can design periodic variation in the resistance per unit length along a transparent conductive element characterized by peaks in resistance per unit length that are at least 2 times the minimum in resistance per unit length, preferably at least 5 times their minimum, more preferably at least 10 times there minimum.

In other embodiments that include selective breaks in an otherwise continuous and uniform mesh, the breaks can be placed in order to create approximately continuously varying sheet resistance in a given direction. The continuously varying sheet resistance can be useful for amplifying the non-linearity of electric field along a transparent conductive element, beyond that which would be created only by the overall shape of the element. For example, as is known in the art, a transparent conductive element with uniform sheet resistance, in the form of an elongated isosceles triangle with an electrical potential applied to its base relative to its apex, exhibits non-linear electric field from base to apex due to the gradient in resistance per unit length along the field direction (created by the narrowing width of the triangle). For touch sensors based on interdigitated arrays of such triangular transparent conductive elements, it would be advantageous for the non-linearity in electric field to be even greater, leading to greater signal-to-noise ratio for circuitry used to decode the position of an object (e.g., a finger) near the array. By selecting the width, thickness, and area density of traces, together with the population of breaks, one can design sheet resistance per unit length along a transparent conductive element that increases by a factor of at least 1.1 over a distance of 1 centimeter, or at least 1.2, or at least 1.5, or at least 2.

In some embodiments, two transparent conductive regions with different sheet resistance in at least one direction are created by including in each of the two regions a contiguous mesh with its own design, each mesh not necessarily including selectively placed breaks. Examples of two meshes with designs that lead to different values of sheet resistance for current passing in a single direction, for example the x direction in FIG. 2, include two meshes with the same thickness (dimension in the z direction in FIG. 2) of the same conductive material deposit but with different amounts with current-carrying cross-sectional area (y-z plane in FIG. 2) per unit width in the y direction. One example of such a pair of mesh regions are two square grid regions each comprising conductive traces of width 2 micrometers but with different pitch, for example 100 micrometers and 200 micrometers. Another example of such a pair of mesh regions are two rectangular grid regions (non-square, with 100 micrometer pitch in the one direction and 200 micrometer pitch in the orthogonal direction) each comprising conductive traces of width 2 micrometers but with different orientation, for example with the long axes of the rectangular cells in the first regions oriented at 90 degrees with respect to the rectangular cells in the second region.

In some embodiments, the sensors include an insulating visible light transparent substrate layer that supports a pattern of conductor, the pattern includes a visible light transparent micropattern region and a region having a larger feature that is not transparent, wherein the visible light transparent micropattern region and the larger feature region include a patterned deposit of the same conductor (for example, a metal) at approximately the same thickness. The larger feature can take the form of, for example, a wide conductive trace that makes contact to a visible light transparent conductive micropattern region or a pad for making contact with an electronic decoding, signal generation, or signal processing device. The width of useful larger features, in combination on the same insulating layer with visible light transparent conductive micropattern regions, is for example between 25 micrometers and 3 mms, between 25 micrometers and 1 mm, between 25 micrometers and 500 micrometers, between 25 micrometers and 250 micrometers, or between 50 micrometers and 100 micrometers.

One illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 1 and 4 micrometers. The first region micropattern has a first sheet resistance value in a first direction between 5 and 100 ohm per square, is visible light transparent, and has between 96% and 99.5% open area. The second region micropattern has a second sheet resistance value in the first direction that is different than the first sheet resistance value.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The micropattern also includes electrically isolated conductor deposits. For all 1 mm by 1 mm square regions of the sensor that lie in the visible light transparent sensing area, none of the regions have a shadowed area fraction that differs by greater than 75 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The micropattern also includes electrically isolated conductor deposits. For all 5 mm by 5 mm square regions of the sensor that lie in the visible light transparent sensing area, none of the regions have a shadowed area fraction that differs by greater than 50 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 1 and 4 micrometers. The first region micropattern has an anisotropic first sheet resistance with a difference in sheet resistance values for orthogonal directions of a factor of at least 1.5, is visible light transparent, and has between 96% and 99.5% open area.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The micropattern also includes electrically isolated conductor deposits. For all 1 mm by 1 mm square regions of the sensor that lie in the visible light transparent sensing area, none of the regions have a shadowed area fraction that differs by greater than 75 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The micropattern also includes electrically isolated conductor deposits. For all 5 mm by 5 mm square regions of the sensor that lie in the visible light transparent sensing area, none of the regions have a shadowed area fraction that differs by greater than 50 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern is visible light transparent, and has between 95% and 99.5% open area. The micropattern also includes electrically isolated conductor deposits. For all 1 mm by 1 mm square regions of the sensor that lie in the visible light transparent sensing area, none of the regions have a shadowed area fraction that differs by greater than 75 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern is visible light transparent, and has between 95% and 99.5% open area. The micropattern also includes electrically isolated conductor deposits. For all 5 mm by 5 mm square regions of the sensor that lie in the visible light transparent sensing area, none of the regions have a shadowed area fraction that differs by greater than 50 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has a first sheet resistance value in a first direction between 5 and 100 ohm per square, is visible light transparent, and has between 95% and 99.5% open area. The micropattern also includes electrically isolated conductor deposits. For all 1 mm by 1 mm square regions of the sensor that lie in the visible light transparent sensing area, none of the regions have a shadowed area fraction that differs by greater than 75 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has a first sheet resistance value in a first direction between 5 and 100 ohm per square, is visible light transparent, and has between 95% and 99.5% open area. The micropattern also includes electrically isolated conductor deposits. For all 5 mm by 5 mm square regions of the sensor that lie in the visible light transparent sensing area, none of the regions have a shadowed area fraction that differs by greater than 50 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The sensor also includes larger electrically conductive features disposed on or in the visible light transparent substrate, the larger features comprising a continuous conductor deposit of the same material and thickness as included in the micropattern and measuring at least 25 micrometers in minimum dimension.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The sensor also includes larger electrically conductive features disposed on or in the visible light transparent substrate, the larger features comprising a continuous conductor deposit of the same material and thickness as included in the micropattern and measuring at least 25 micrometers in minimum dimension.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The sensor also includes larger electrically conductive features disposed on or in the visible light transparent substrate, the larger features comprising a continuous conductor deposit of the same material and thickness as included in the micropattern and measuring at least 500 micrometers in minimum dimension.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The sensor also includes larger electrically conductive features disposed on or in the visible light transparent substrate, the larger features comprising a continuous conductor deposit of the same material and thickness as included in the micropattern and measuring at least 500 micrometers in minimum dimension.

EXAMPLES

The following describe exemplary touch screen sensor designs. They can be fabricated using known photolithographic methods, for example as described in U.S. Pat. No. 5,126,007 or U.S. Pat. No. 5,492,611. The conductor can be deposited using physical vapor deposition methods, for example sputtering or evaporation, as is known in the art. Each conductive pattern exemplified herein is useful as a transparent touch screen sensor, when connected to decoding circuitry, as is known in the art (e.g., U.S. Pat. No. 4,087,625; U.S. Pat. No. 5,386,219; U.S. Pat. No. 6,297,811; WO 2005/121940 A2).

Example 1

Figure 3:
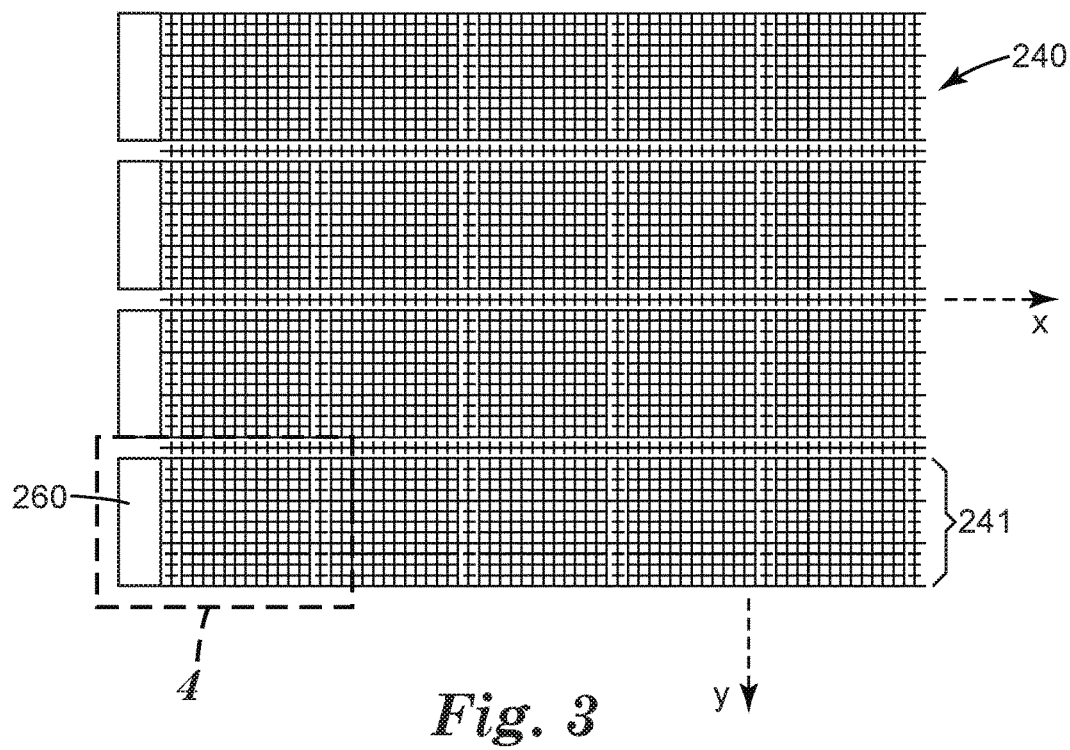
FIG. 3 illustrates the conductor micropattern for one embodiment of the touch screen sensor.
Figure 4:
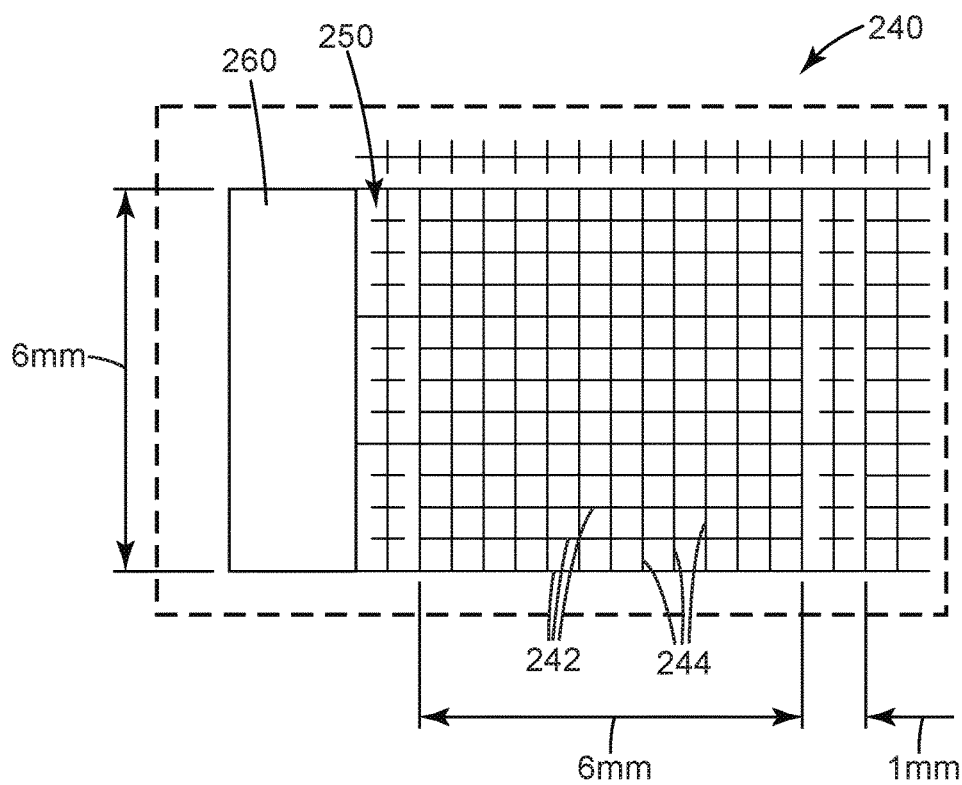
FIG. 4 illustrates a portion of the conductor micropattern illustrated in FIG. 3, the portion including a conductive mesh with selective breaks for modulating the local sheet resistance as well as a larger feature in the form of a contact pad.
Figure 5:
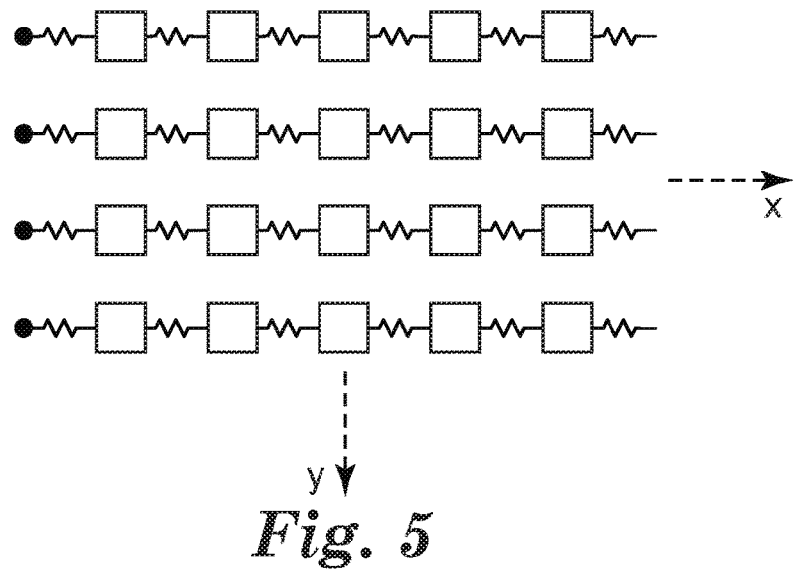
FIG. 5 is a circuit diagram that approximates the properties of the conductor micropattern illustrated in FIG. 3, where capacitive plates are separated by resistive elements.
Figure 6:
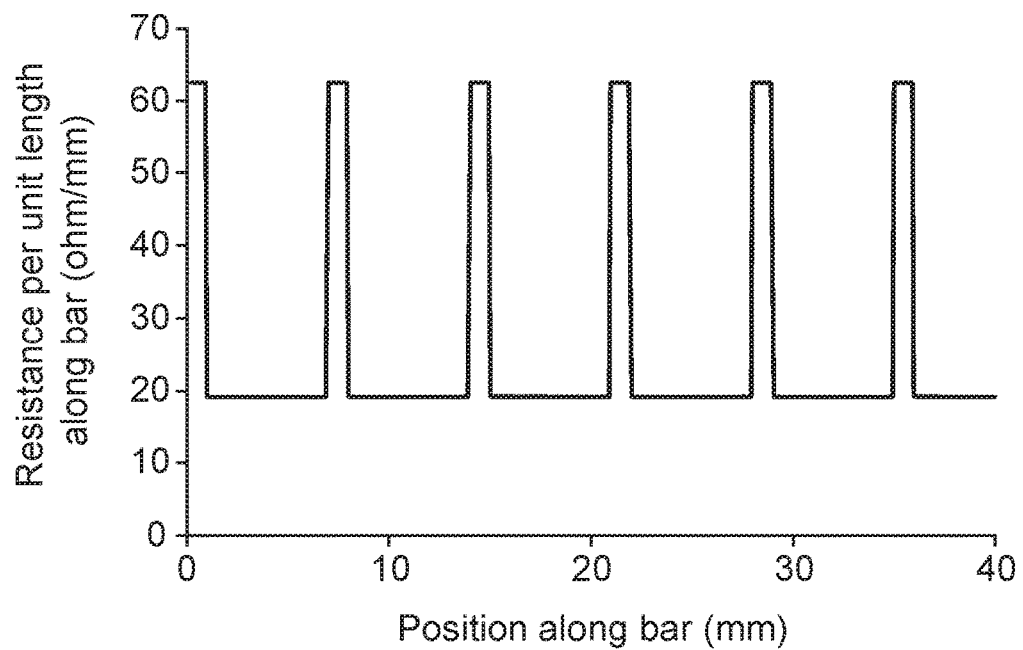
FIG. 6 illustrates a modulation in resistance along the horizontal mesh bars given in FIG. 3, created by selective breaks in the contiguous mesh.

A micropattern of thin film gold according to the following description is deposited onto a thin sheet of colorless glass (approximately 1 mm in thickness). The micropattern 240 is depicted in FIG. 3 and FIG. 4. The thickness or height of the gold layer is about 100 nanometers. The micropattern 240 involves a series of horizontal (x-axis) mesh bars 241 comprising horizontal narrow traces 242, the traces 242 measuring approximately 2 micrometers in width. Four of these horizontal mesh traces 242 are in electrical communication with a larger feature contact pad 260. The mesh bars measure approximately 6 mm in width. Accordingly, with thirteen evenly spaced traces 244 traversing a width (y-axis) of 6 mm and thirteen evenly spaced traces 242 traversing a length (x-axis) of 6 mm, the pitch of the square grid of traces is 500 micrometers. As depicted in FIG. 4, certain traces have breaks 250, measuring approximately 25 micrometers (exaggerated in the figures, for ease in locating). For a square grid with 2 micrometers wide opaque traces on a 500 micrometer pitch, the fill factor for opaque traces is 0.80%, thus leading to an open area of 99.20%. For the same square grid, except with a 25 micrometer break every 500 micrometers, the fill factor is 0.78%, thus leading to an open area of 99.22%. Thus, the design includes 1 mm×6 mm regions with 99.22% open area and 6 mm×6 mm regions with 99.20% open area. The average visible transmittance of the glass article with mesh is approximately 0.92×0.992=91% (with the factor of 0.92 related to interfacial reflection losses in light transmission in the non-conductor-deposited areas of the pattern). Along the horizontal bar direction, there is a series of complete grid regions connected together by four traces of gold. Assuming an effective bulk resistivity of 5E-06 ohm-cm for sputtered thin film gold, each 2 micrometer wide, 500 micrometer long segment of thin film gold has a resistance of approximately 125 ohms. The regions with a completed grid, for current passing in the direction of the bars, have an effective sheet resistance of approximately 115 ohms per square. The four traces connecting the regions with completed grids create approximately 62.5 ohms of resistance between the regions. The above described arrangement of conductive trace elements leads to a spatially varying resistance per unit length along the bar direction as plotted in FIG. 6. FIG. 5 illustrates an equivalent circuit for the array of horizontal mesh bars. The circuit has a series of plates connected by resistors.

Example 2

Figure 7:
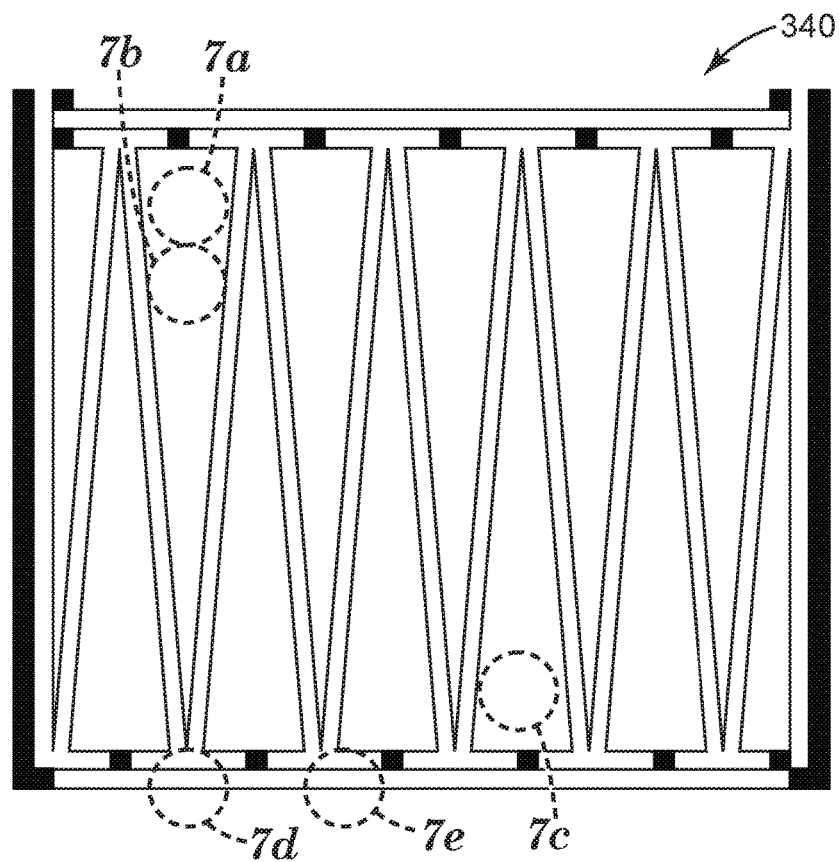
FIG. 7 illustrates the conductor micropattern for one embodiment of the touch screen sensor, the micropattern including regions labeled 7*a*-7*e* with different sheet resistance created in part by selective breaks in the electrically conductive micropattern mesh.
Figure 7A:
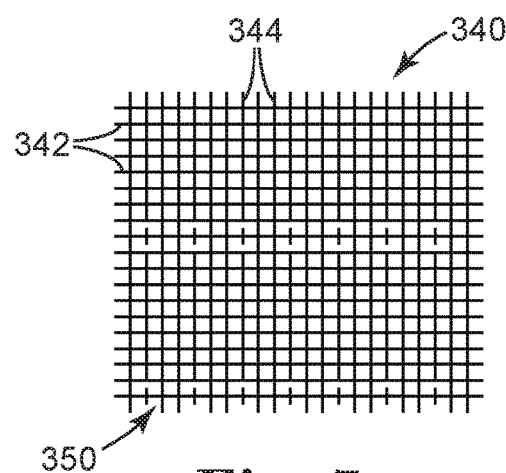
FIGS. 7*a*-7*e* each illustrate a portion of the varying conductor micropattern illustrated in FIG. 7.
Figure 7B:
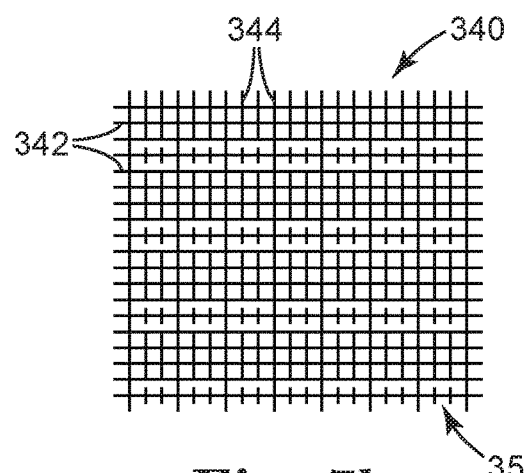
Figure 7C:
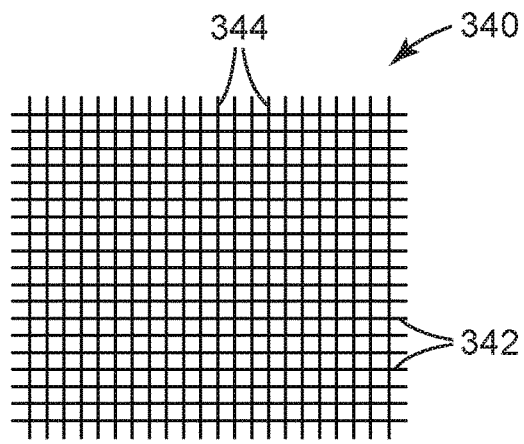
Figure 7D:
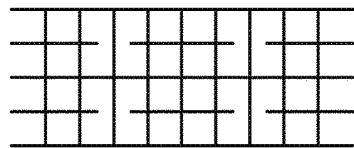
Figure 7E:
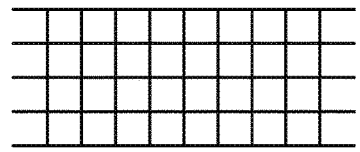

A micropattern of thin film gold according to the following description is deposited onto a thin sheet of colorless glass (approximately 1 mm in thickness). The micropattern 340 is depicted in FIG. 7. The thickness of the gold is about 100 nanometers. The micropattern 340 has transparent conductive regions in the form of a series of interdigitated wedges or triangles. Each wedge is comprised of a mesh made up of narrow metallic traces 342, 344, the traces 342, 344 (see FIG. 7a-FIG. 7c) measuring approximately 2 micrometers in width. The mesh wedges measure approximately 1 centimeter in width at their base and approximately six centimeters in length. The pitch of the square grid of traces 342, 344 is 500 micrometers. Within selected regions of the mesh (see FIG. 7a-FIG. 7b), within a wedge, breaks 350 measuring approximately 25 micrometers in length are placed intentionally to affect the local sheet resistance within the wedge, for current passing along its long axis. As depicted in FIG. 7a and FIG. 7b, regions 7a and 7b (the regions being separated by approximately 1 centimeter in FIG. 7), breaks 350 are included in the mesh that increase the sheet resistance in the direction of the long axis by a factor greater than 1.2. The overall design also includes region 7c (as depicted in FIG. 7c), which is electrically isolated and spaced apart from regions 7a and 7b, and which has a mesh of with sheet resistance value less than those of regions 7a and 7b. The mesh region 7c has an open area of 99.20%, while the mesh regions 7a and 7b have open area fractions of 99.20% and 99.21% respectively. The overall design also includes regions 7d and 7e (as depicted in FIG. 7d and FIG. 7e) with meshes of larger pitch than regions 7a, 7b and 7c, but with the same width of traces, leading to increased sheet resistance and visible transmittance.

Figure 8:
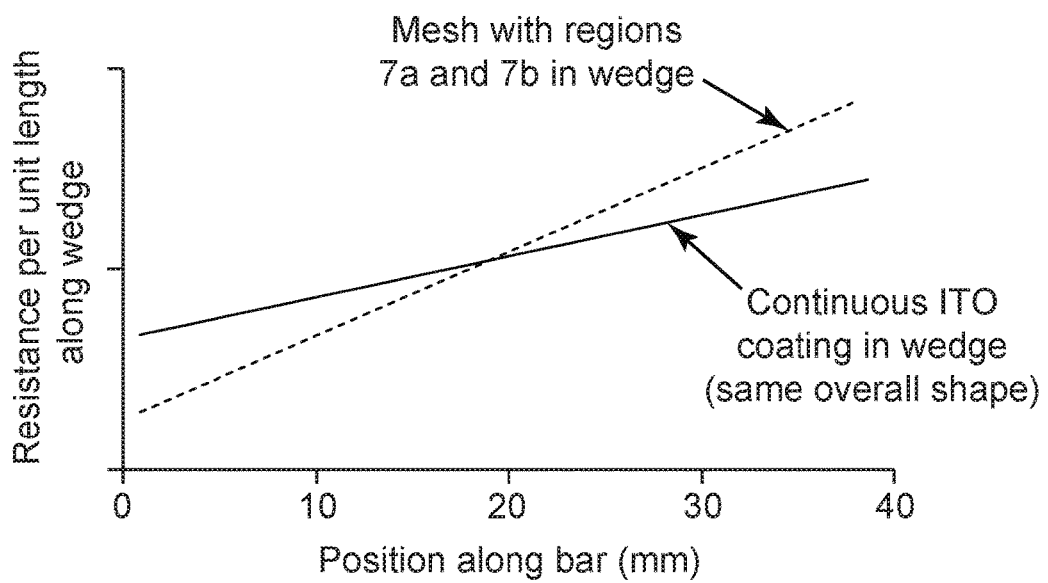
FIG. 8 illustrates the distribution of resistance per unit length along the long axis of the wedge-shaped transparent conductive region having regions 7*a* and 7*b* therein, as compared with the resistance per unit length for a similarly shaped region comprising only a uniform transparent conducting oxide, ITO.

FIG. 8 illustrates the effect of engineering the mesh properties as described above on the gradient in resistance along a wedge, versus the use of a standard ITO coating for the same shape of region. The overall design also includes larger conductive features in the form of conductive leads along the left and right sides of the pattern, the leads being approximately 1 mm wide and patterned from thin film gold with approximately 100 nanometers thickness.

Example 3

Figure 9:
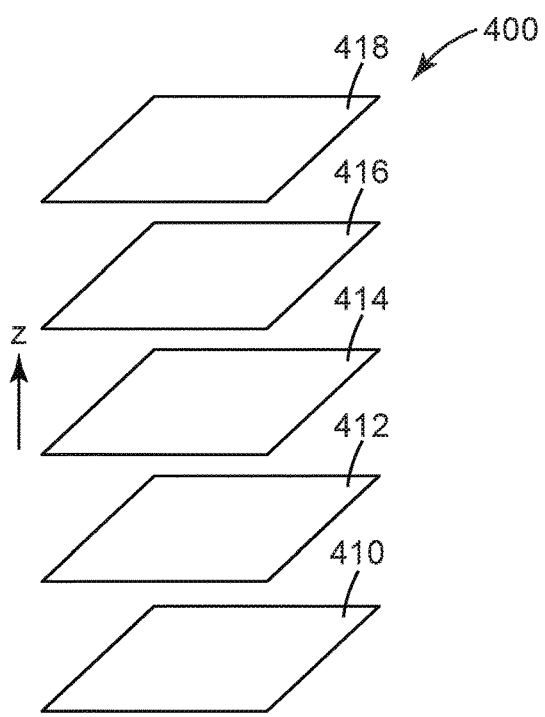
FIG. 9 illustrates the arrangement of layers that are laminated together to form one embodiment of the touch screen sensor, an X-Y grid type projected capacitive touch screen sensor.

A transparent sensor element 400 for a touch screen sensor is illustrated in FIG. 9. The sensor element 400 includes two patterned conductor layers 410, 414, (e.g., an X axis layer and a Y axis layer) two optically clear adhesive layers 412, 416, and a base plate 418, laminated together and depicted as separated in FIG. 9 for clarity. Layers 410 and 414 include transparent conductive mesh bars where one layer is oriented in the x axis direction and the other layer is orientated in the y axis direction, with reference to FIG. 2. The base plate 418 is a sheet of glass measuring 6 centimeter by 6 centimeters in area and 1 mm in thickness. A suitable optically clear adhesive is Optically Clear Laminating Adhesive 8141 from 3M Company, St. Paul, Minn. For each of the X-layer and the Y-layer, a clear polymer film with a micropattern of metal is used. A micropattern of thin film gold according to the following description is deposited onto a thin sheet of PET. Suitable PET substrates include ST504 PET from DuPont, Wilmington, Del., measuring approximately 125 micrometers in thickness.

Figure 10:
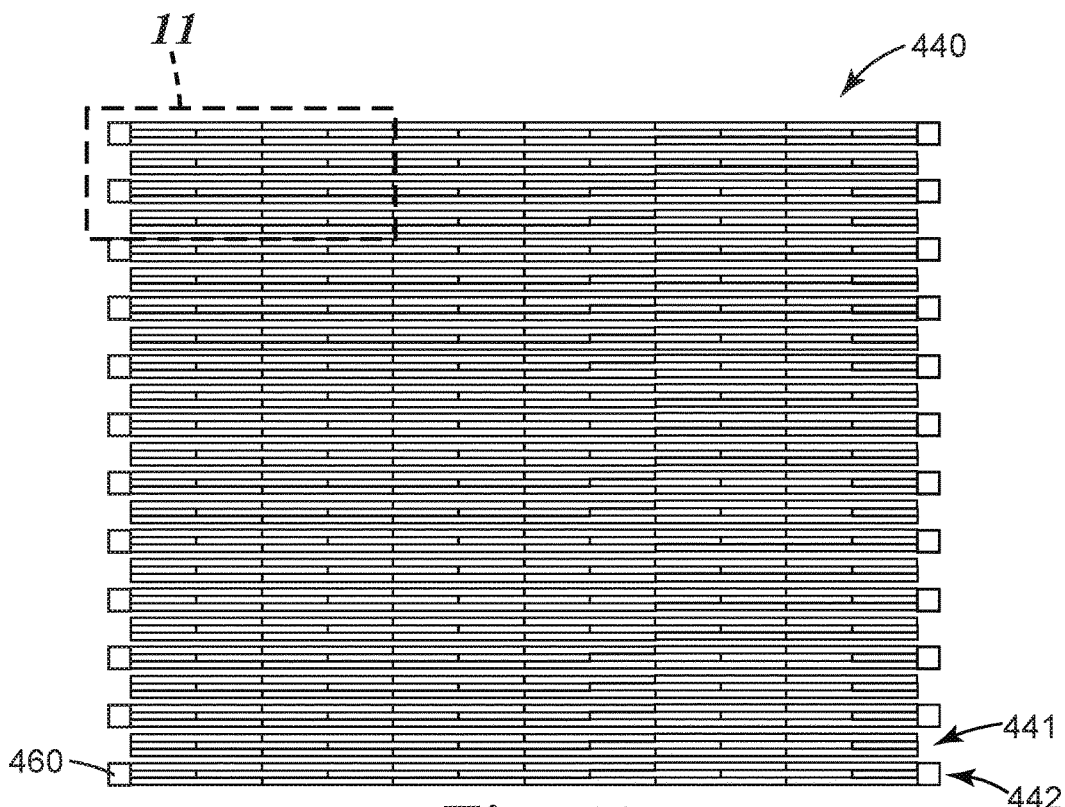
FIG. 10 illustrates the conductor micropattern for the X-layer or the Y-layer of an embodiment of the touch screen sensor according to FIG. 9.
Figure 11:
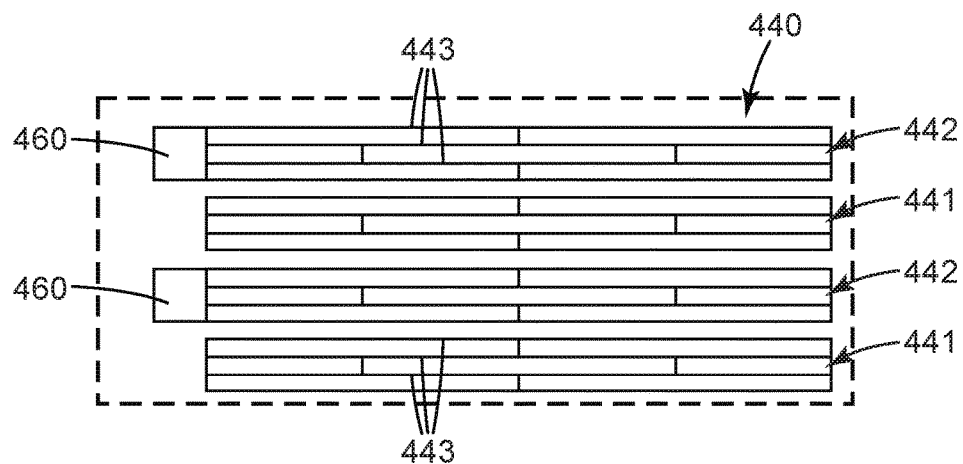
FIG. 11 illustrates a portion of the conductor micropattern illustrated in FIG. 10, the portion including a visible light transparent conductive mesh contacting a larger feature in the form of a contact pad, as well as electrically isolated conductor deposits in the space between the mesh regions.

The micropattern 440 is depicted in FIG. 10 and FIG. 11. The thickness of the gold is about 100 nanometers. The micropattern has transparent conductive regions in the form of a series of parallel mesh bars 442. In addition to mesh bars that are terminated with square pads 460 (approximately 2 mm by 2 mm in area, comprising continuous conductor in the form of thin film gold with thickness approximately 100 nanometers) for connection to an electronic device for capacitive detection of finger touch to the base plate, there are mesh bars 441 that are electrically isolated from the electronic device. The isolated mesh bars 441 serve to maintain optical uniformity across the sensor. Each bar is comprised of a mesh made up of narrow metallic traces 443, the traces 443 measuring approximately 5 micrometers in width. The mesh bars each measure approximately 2 mm in width and 66 mm in length. Within each mesh bar are rectangular cells measuring approximately 0.667 mm in width and 12 mm in length. This mesh design serves to provide ties between long-axis traces in each mesh bar, to maintain electrical continuity along the mesh bar, in case of any open-circuit defects in the long axis traces. However, as opposed to the use of a square mesh with 0.667 mm pitch having such ties, the rectangular mesh of FIG. 10 and FIG. 11 trades off sheet resistance along the mesh bar with optical transmittance more optimally. More specifically, the mesh bar depicted in FIG. 10 and FIG. 11 and a 2 mm wide mesh bar comprising a square mesh with 0.667 mm pitch would both have essentially the same sheet resistance along the long axis of the mesh bar (approximately 50 ohms per square); however, the square grid would occlude 1.5% of the area of the transparent conductive region and the mesh depicted in FIG. 10 and FIG. 11 occludes only 0.8% of the area of the transparent conductive region.

Example 4

A transparent sensor element for a touch screen sensor is described. The sensor element includes two patterned conductor layers, two optically clear adhesive layers, and a base plate as depicted in FIG. 9. The base plate is a sheet of glass measuring 6 centimeter by 6 centimeters in area and 1 mm in thickness, laminated together as depicted in FIG. 9. A suitable optically clear adhesive is Optically Clear Laminating Adhesive 8141 from 3M Company. For each of the X-layer and the Y-layer, a clear polymer film with a micropattern of metal is used. A micropattern of thin film gold according to the following description is deposited onto a thin sheet of PET. Suitable PET substrates include ST504 PET from DuPont, measuring approximately 125 micrometers in thickness.

Figure 12:
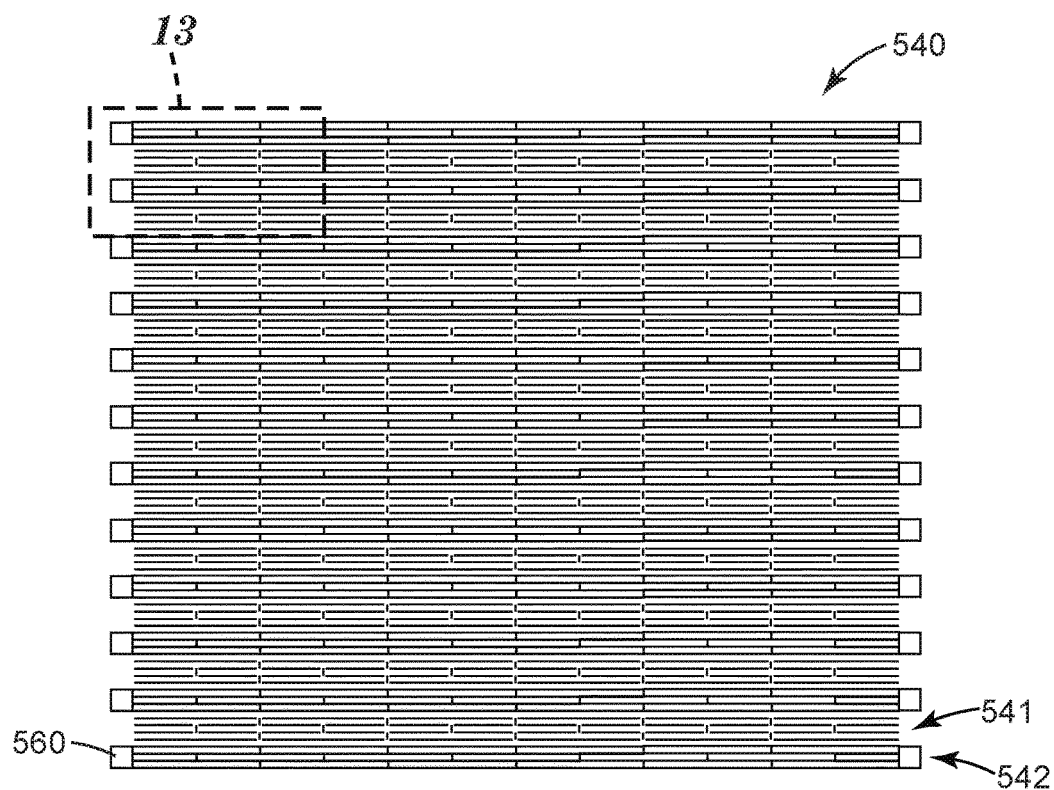
FIG. 12 illustrates the conductor micropattern for the X-layer or the Y-layer of another embodiment of the touch screen sensor according to FIG. 9.
Figure 13:
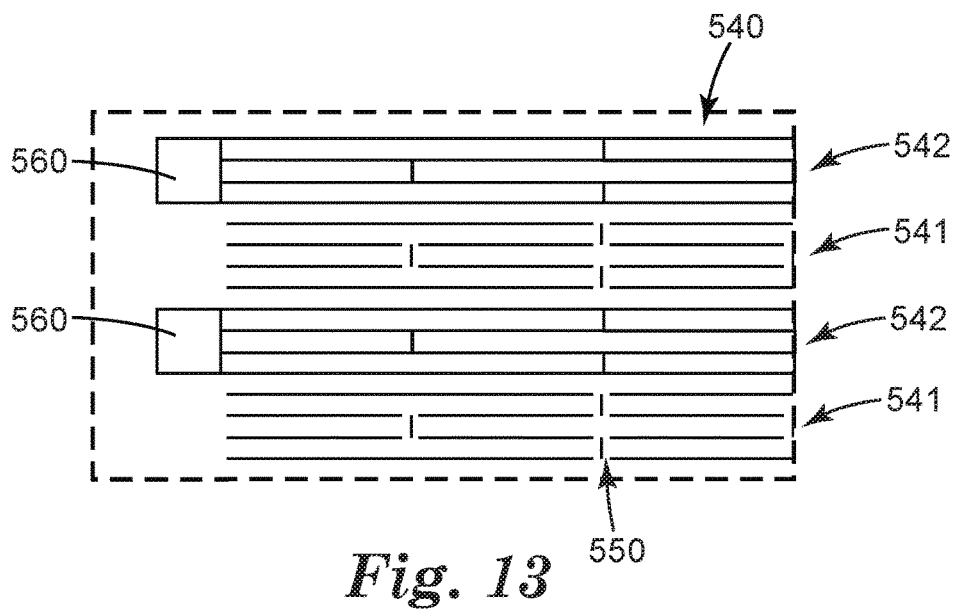
FIG. 13 illustrates a portion of the conductor micropattern given in FIG. 12, the portion including a visible light transparent conductive mesh contacting a larger feature in the form of a contact pad, as well as electrically isolated conductor deposits in the space between the mesh regions.

The micropattern 540 is depicted in FIG. 12 and FIG. 13. The thickness of the gold is 100 nanometers. The micropattern 540 has transparent conductive regions in the form of a series of parallel mesh bars 542. In addition to mesh bars 542 that are terminated with square pads 560 for connection to an electronic device for capacitive detection of finger touch to the base plate, there are straight line segments 541 that are electrically isolated from the electronic device. The straight line segments 541 lie in regions between the mesh bars 542, with essentially the same geometry as the mesh bars, except for approximately 25 micrometer breaks 550 as depicted in FIG. 13. The isolated line segments 541 serve to maintain optical uniformity across the sensor. Each bar 542 is comprised of a mesh made up of narrow metallic traces, the traces measuring approximately 5 micrometers in width. The mesh bars 542 each measure approximately 2 mm in width and 66 mm in length. Within each mesh bar 542 are rectangular cells measuring approximately 0.667 mm in width and 12 mm in length. The mesh 542 depicted in FIG. 12 and FIG. 13 occludes 0.8% of its area within the transparent conductive region. The isolated line segments 541 depicted in FIG. 12 and FIG. 13 also occlude 0.8% of the area within the region they occupy between the mesh bars 542.

Example 5

A transparent sensor element for a touch screen sensor is described. The sensor element includes two patterned conductor layers, two optically clear adhesive layers, and a base plate as depicted in FIG. 9. The base plate is a sheet of glass measuring 6 centimeter by 6 centimeters in area and 1 mm in thickness, laminated together as depicted in FIG. 9. A suitable optically clear adhesive is Optically Clear Laminating Adhesive 8141 from 3M Company. For each of the X-layer and the Y-layer, a clear polymer film with a micropattern of metal is used. A micropattern of thin film gold according to the following description is deposited onto a thin sheet of PET. Suitable PET substrates include ST504 PET from DuPont, measuring approximately 125 micrometers in thickness.

Figure 14:
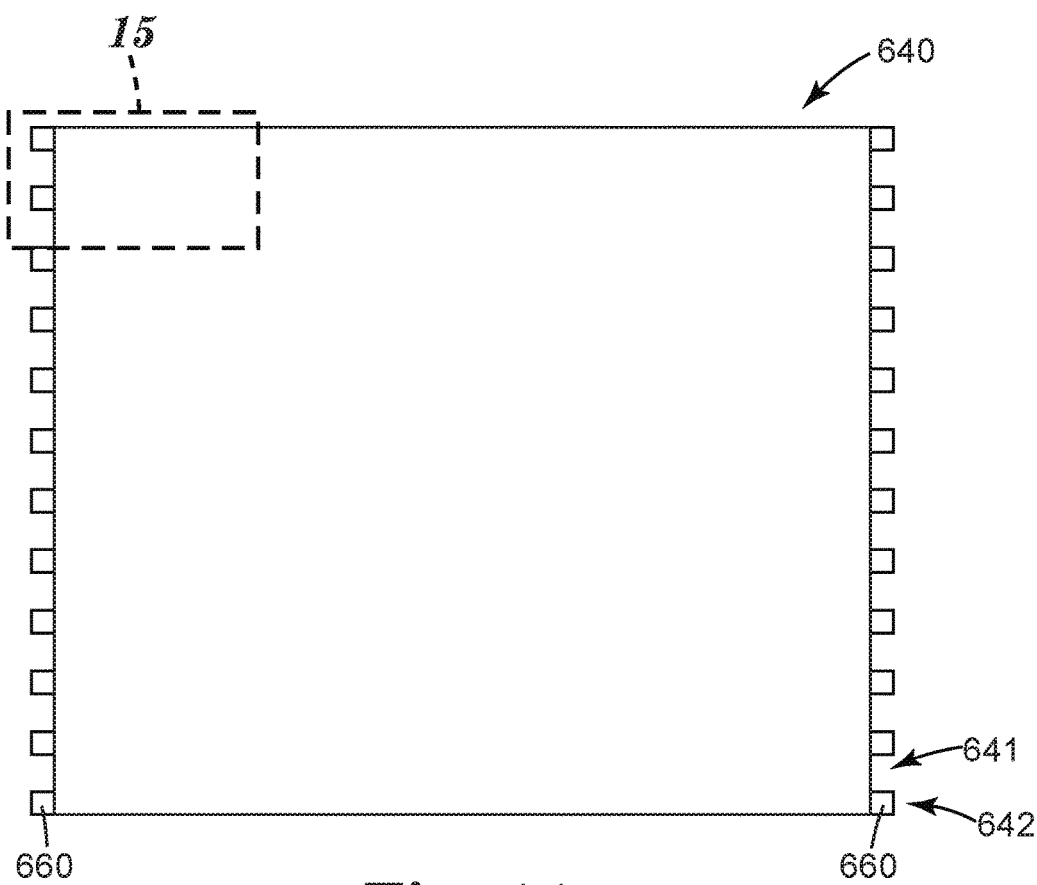
FIG. 14 illustrates the conductor micropattern for the X-layer or the Y-layer of another embodiment of the touch screen sensor according to FIG. 9.
Figure 15:
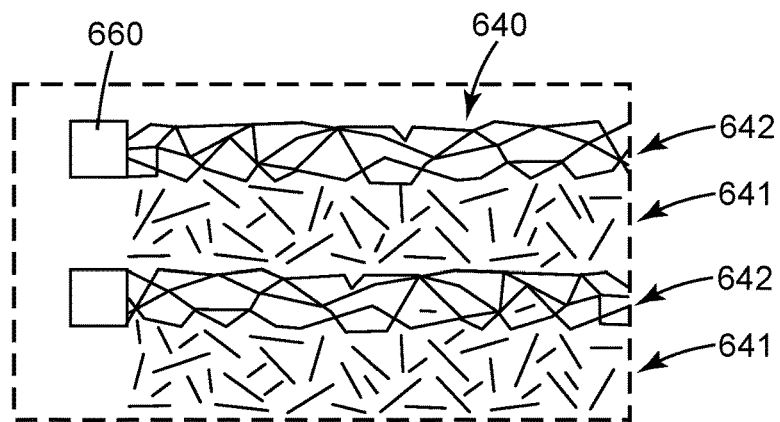
FIG. 15 illustrates a portion of the conductor micropattern given in FIG. 14, the portion including a visible light transparent conductive mesh contacting a larger feature in the form of a contact pad, as well as electrically isolated conductor deposits in the space between the mesh regions.

The micropattern 640 is depicted in FIG. 14 and FIG. 15. The thickness of the gold is about 100 nanometers. The micropattern 640 has transparent conductive regions in the form of a series of parallel mesh bars 642. In addition to mesh bars 642 that are terminated with square pads 660 for connection to an electronic device for capacitive detection of finger touch to the base plate, there are straight line segments 641 that are electrically isolated from the electronic device. The straight line segments 641 lie in regions between the mesh bars, with a similar geometry to the line segments of the mesh bars. The electrically isolated line segments 641 serve to maintain optical uniformity across the sensor. Each bar 641, 642 is comprised of narrow metallic traces, the traces measuring approximately 3 micrometers in width. The mesh bars 642 each measure approximately 2 mm in width and 66 mm in length. Within each mesh bar 642 comprising randomly shaped cells. The mesh 642 depicted in FIG. 14 and FIG. 15 occludes less than 5 percent of its area within the transparent conductive region. The isolated line segments 641 depicted in FIG. 14 and FIG. 15 also occlude less than 5 percent of the area within the region they occupy between the mesh bars.

Example 6

Figure 16:
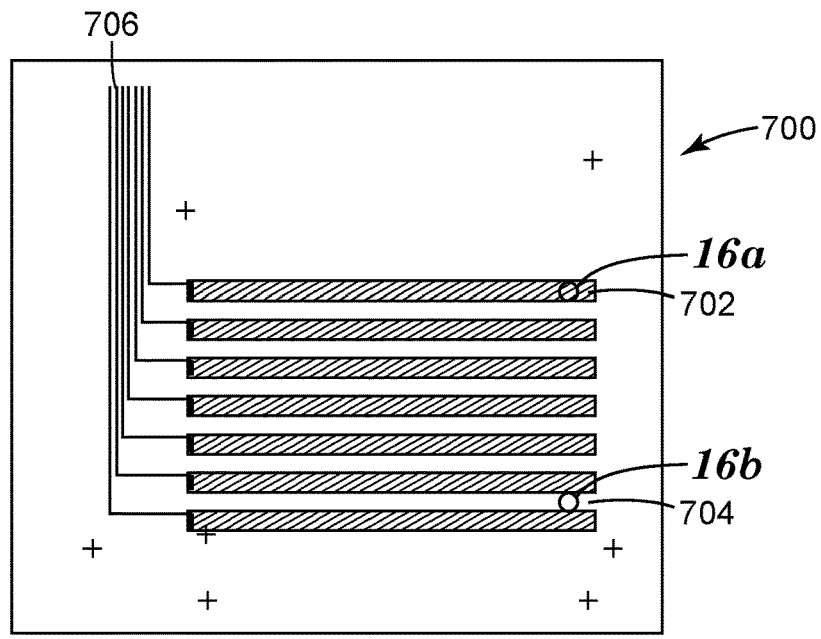
FIGS. 16, 16a, and 16b illustrate various portions of a first patterned substrate.
Figure 18:
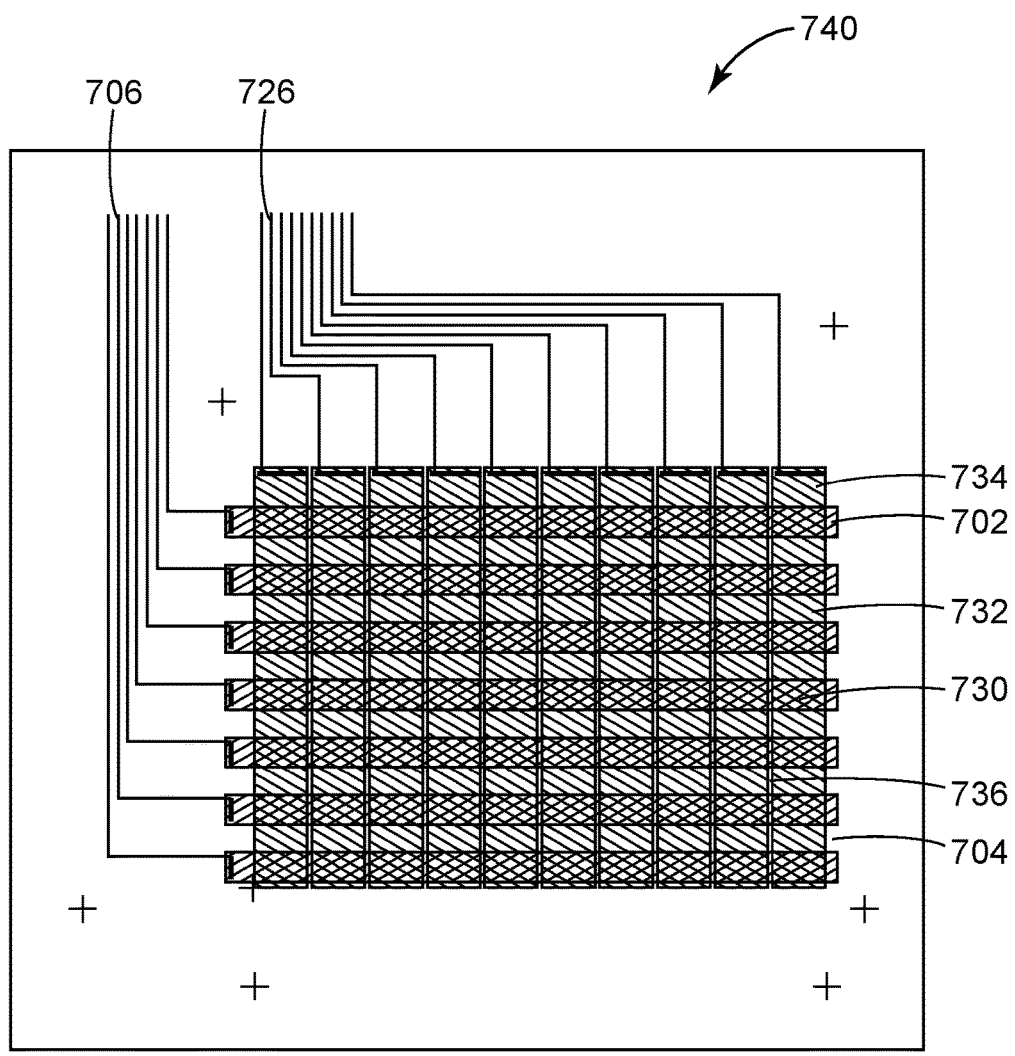
FIG. 18 illustrates a projected capacitive touch screen transparent sensor element constructed from the first and second patterned substrates of FIGS. 16 and 17.

A transparent sensor element was fabricated and combined with a touch sensor drive device as generally shown in FIGS. 16, 17 and 18 using microcontact printing and etching as described in co-assigned application 12/393,201. The device was then integrated with a computer processing unit connected to a display to test the device. The device was able to detect the positions of multiple single and or simultaneous finger touches, which was evidenced graphically on the display.

Formation of a Transparent Sensor Element

First Patterned Substrate

A first visible light substrate made of polyethylene terephthalate (PET) having a thickness of 125 micrometers (μm) was vapor coated with 100 nm silver thin film using a thermal evaporative coater to yield a first silver metalized film. The PET was commercially available as product number ST504 from E.I. du Pont de Nemours, Wilmington, Del. The silver was commercially available from Cerac Inc., Milwaukee, Wis. as 99.99% pure 3 mm shot.

A first poly(dimethylsiloxane) stamp, referred to as PDMS and commercially available as product number Sylgard 184, Dow Chemical Co., Midland, Mich., having a thickness of 3 mm, was molded against a 10 cm diameter silicon wafer (sometimes referred to in the industry as a "master") that had previously been patterned using standard photolithography techniques. The PDMS was cured on the silicon wafer at 65° C. for 2 hours. Thereafter, the PDMS was peeled away from the wafer to yield a first stamp having two different low-density regions with patterns of raised features, a first continuous hexagonal mesh pattern and a second discontinuous hexagonal mesh pattern. That is, the raised features define the edges of edge-sharing hexagons. A discontinuous hexagon is one that contains selective breaks in a line segment. The selective breaks had a length less than 10 µm. The breaks were designed and estimated to be approximately 5 µm. In order to reduce their visibility, it was found that preferably, the breaks should be less than 10 µm, more preferably 5 µm or less, e.g., between 1 and 5 µm. Each raised hexagon outline pattern had a height of 2 µm, had 1% to 3% area coverage, corresponding to 97% to 99% open area, and line segments that measured from 2 to 3 µm in width. The first stamp also included raised features defining 500 µm wide traces. The first stamp has a first structured side that has the hexagonal mesh pattern regions and the traces and an opposing second substantially flat side.

The stamp was placed, structured side up, in a glass Petri dish containing 2 mm diameter glass beads. Thus, the second, substantially flat side was in direct contact with the glass beads. The beads served to lift the stamp away from the base of the dish, allowing the following ink solution to contact essentially all of the flat side of the stamp. A 10 millimolar ink solution of 1-octadecanethiol (product number C18H3CS, 97%, commercially available from TCI America, Portland Oreg.) in ethanol was pipetted into the Petri dish beneath the stamp. The ink solution was in direct contact with the second substantially flat side of the stamp. After sufficient inking time (e.g., 3 hours) where the ink has diffused into the stamp, the first stamp was removed from the petri dish. The inked stamp was placed, structured side up, onto a working surface. The first silver metalized film was applied using a hand-held roller onto the now inked structured surface of the stamp such that the silver film was in direct contact with the structured surface. The metalized film remained on the inked stamp for 15 seconds. Then the first metalized film was removed from the inked stamp. The removed film was placed for three minutes into a silver etchant solution, which contained (i) 0.030 molar thiourea (product number T8656, Sigma-Aldrich, St. Louis, Mo.) and (ii) 0.020 molar ferric nitrate (product number 216828, Sigma-Aldrich) in deionized water. After the etching step, the resulting first substrate was rinsed with deionized water and dried with nitrogen gas to yield a first patterned surface. Where the inked stamp made contact with the silver of the first metalized substrate, the silver remained after etching. Thus silver was removed from the locations where contact was not made between the inked stamp and silver film.

Figure 16A:
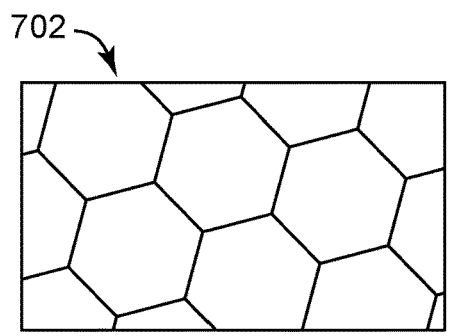
Figure 16B:
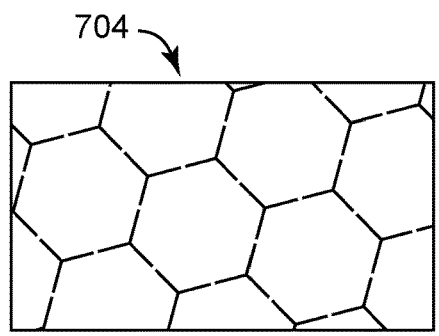

FIGS. 16, 16a and 16b show a first patterned substrate 700 having a plurality of first continuous regions 702 alternating between a plurality of first discontinuous regions 704 on a first side of the substrate, which is the side that contained the now etched and patterned silver metalized film. The substrate has an opposing second side that is substantially bare PET film. Each of the first regions 702 has a corresponding 500 µm wide conductive trace 706 disposed at one end. FIG. 16a shows an exploded view of the first region 702 having a plurality of continuous lines forming a hexagonal mesh structure. FIG. 16b shows an exploded view of the first discontinuous region 704 having a plurality of discontinuous lines (shown as selective breaks in each hexagon) forming a discontinuous hexagonal mesh structure. The breaks were designed and estimated to be approximately 5 µm. In order to reduce their visibility, it was found that preferably, the breaks should be less than 10 µm, more preferably 5 µm or less, e.g., between 1 and 5 µm. Each mesh structure of regions 702 and 704 had 97% to 99% open area. Each line segment measured from 2 to 3 µm.

Second Patterned Substrate

The second patterned substrate was made as the first patterned substrate using a second visible light substrate to produce a second silver metalized film. A second stamp was produced having a second continuous hexagonal mesh pattern interposed between a second discontinuous hexagonal mesh pattern.

FIGS. 17, 17a and 17b show a second patterned substrate 720 having a plurality of second continuous regions 722 alternating between a plurality of second discontinuous regions 724 on a first side of the second substrate. Each of the second regions 722 has a corresponding 500 µm wide second conductive trace 726 disposed at one end. FIG. 17a shows an exploded view of one second region 722 having a plurality of continuous lines forming a hexagonal mesh structure. FIG. 17b shows an exploded view of one second discontinuous region 724 having a plurality of discontinuous lines (shown as selective breaks in each hexagon) forming discontinuous hexagonal mesh structure. Each mesh structure of region 722 and 724 had 97% to 99% open area. Each line segment measured from 2 to 3 µm.

Formation of a Projected Capacitive Touch Screen Sensor Element

The first and second patterned substrates made above were used to produce a two-layer projected capacitive touch screen transparent sensor element as follows.

The first and second patterned substrates were adhered together using Optically Clear Laminating Adhesive 8141 from 3M Company, St. Paul, Minn. to yield a multilayer construction. A handheld roller was used to laminate the two patterned substrates with the regions of the first and second conductive trace regions 706 and 726 being adhesive free. The multilayer construction was laminated to a 0.7 mm thick float glass using Optically Clear Laminating Adhesive 8141 such that the first side of the first substrate was proximate to the float glass. The adhesive free first and second conductive trace regions 706 and 726 allowed electrical connection to be made to the first and second patterned substrates 700 and 720.

FIG. 18 shows a top plan view of a multilayer touch screen sensor element 740 where the first and second patterned substrate have been laminated. Region 730 represented the overlap of the first and second continuous regions. Region 732 represented the overlap of the first continuous region and the second discontinuous region. Region 734 represented the overlap of the second continuous region and the first discontinuous region. And, region 736 represented the overlap between the first and second discontinuous regions. While there was a plurality of these overlap regions, for ease of illustration, only one region of each has been depicted in the figure.

The integrated circuits used to make mutual capacitance measurements of the transparent sensor element were PIC18F87J10 (Microchip Technology, Chandler, Ariz.), AD7142 (Analog Devices, Norwood, Mass.), and MN74HC154WM (Fairchild Semiconductor, South Portland, Me.). The PIC18F87J10 was the microcontroller for the system. It controlled the selection of sensor bars which MN74HC154WM drives. It also configured the AD7142 to make the appropriate measurements. Use of the system included setting a number of calibration values, as is known in the art. These calibration values can vary from touch screen to touch screen. The system could drive 16 different bars and the AD7142 can measure 12 different bars. The configuration of the AD7142 included selection of the number of channels to convert, how accurately or quickly to take measurements, if an offset in capacitance should be applied, and the connections for the analog to digital converter. The measurement from the AD7142 was a 16 bit value representing the capacitance of the cross point between conductive bars in the matrix of the transparent sensor element.

After the AD7142 completed its measurements it signaled the microcontroller, via an interrupt, to tell it to collect the data. The microcontroller then collected the data over the SPI port. After the data was received, the microcontroller incremented the MM74HC154WM to the next drive line and cleared the interrupt in the AD7142 signaling it to take the next set of data. While the sampling from above was constantly running, the microcontroller was also sending the data to a computer with monitor via a serial interface. This serial interface allowed a simple computer program, as are known to those of skill in the art, to render the raw data from the AD7142 and see how the values were changing between a touch and no touch. The computer program rendered different color across the display, depending on the value of the 16 bit value. When the 16 bit value was below a certain value, based on the calibration, the display region was rendered white. Above that threshold, based on the calibration, the display region was rendered green. The data were sent asynchronously in the format of a 4 byte header (0xAAAAAAAA), one byte channel (0x00-0x0F), 24 bytes of data (represents the capacitive measurements), and carriage return (0x0D).

Results of Testing of the System

The transparent sensor element was connected to the touch sensor drive device. When a finger touch was made to the glass surface, the computer monitor rendered the position of touch that was occurring within the touch sensing region in the form of a color change (white to green) in the corresponding location of the monitor. When two finger touches were made simultaneously to the glass surface, the computer monitor rendered the positions of touches that were occurring within the touch sensing region in the form of a color change (white to green) in the corresponding locations of the monitor. When three finger touches were made simultaneously to the glass surface, the computer monitor rendered the positions of touches that were occurring within the touch sensing region in the form of a color change (white to green) in the corresponding locations of the monitor.

Thus, embodiments of the TOUCH SCREEN SENSOR HAVING VARYING SHEET RESISTANCE are disclosed. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A touch screen sensor, comprising:
a visible light transparent substrate;
an electrically conductive mesh comprising a plurality of first traces having a first width and defining a plurality of enclosed open areas;
an electrically conductive second trace having a second width greater than the first width and making electrical contact with the mesh; and
an electrically conductive pad for making electrical contact with an electronic device;
wherein, the mesh, the second trace and the pad are disposed on or in the visible light transparent substrate and include a same metal at approximately a same thickness.

2. The touch screen sensor of claim 1, wherein the first width is less than or equal to 10 micrometers.

3. The touch screen sensor of claim 1, wherein the mesh comprises random cell shapes, irregular polygons, or a combination thereof.

4. The touch screen sensor of claim 1 wherein the pad has a width between 25 micrometers and 3 mm.

5. The touch screen sensor of claim 1, wherein the mesh has an open area between 90 and 99.5 percent.

6. The touch screen sensor of claim 1, wherein the contact between the pad and the electronic device is for capacitive detection of a finger touch.

7. The touch screen sensor of claim 1, wherein the visible light transparent substrate comprises glass.

* * * * *